(12) United States Patent
Ryoshi et al.

(10) Patent No.: US 9,755,232 B2
(45) Date of Patent: Sep. 5, 2017

(54) NICKEL COMPOSITE HYDROXIDE AND METHOD FOR PRODUCING THE SAME, POSITIVE ELECTRODE ACTIVE MATERIAL AND METHOD FOR PRODUCING THE SAME AS WELL AS NONAQUEOUS ELECTROLYTIC SECONDARY CELL

(71) Applicant: SUMITOMO METAL MINING CO., LTD., Tokyo (JP)

(72) Inventors: Kazuomi Ryoshi, Ehime (JP); Kensaku Mori, Ehime (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 14/132,955

(22) Filed: Dec. 18, 2013

(65) Prior Publication Data
US 2014/0186710 A1   Jul. 3, 2014

(30) Foreign Application Priority Data

Dec. 28, 2012 (JP) ................................. 2012-286848

(51) Int. Cl.
*H01M 4/525* (2010.01)
*C01G 53/00* (2006.01)
(Continued)

(52) U.S. Cl.
CPC ............ *H01M 4/525* (2013.01); *C01D 15/02* (2013.01); *C01G 53/006* (2013.01); *C01G 53/04* (2013.01);
(Continued)

(58) Field of Classification Search
CPC .......... H01M 4/525; C01D 15/02; C30B 7/14; C01G 53/04; C01G 53/50; C01G 53/006;
(Continued)

(56) References Cited

U.S. PATENT DOCUMENTS

| | | | |
|---|---|---|---|
| 2004/0126660 A1* | 7/2004 | Ohzuku et al. | ................ 429/223 |
| 2005/0118508 A1* | 6/2005 | Yong | .................... H01M 2/1673 |
| | | | 429/246 |
| 2012/0085967 A1* | 4/2012 | Yokoyama | ............ H01M 4/525 |
| | | | 252/182.1 |

FOREIGN PATENT DOCUMENTS

| | | | | |
|---|---|---|---|---|
| EP | 0851516 | * | 7/1998 | .............. H01M 4/52 |
| EP | 1044927 | * | 10/2000 | ............. C01G 53/04 |

(Continued)

OTHER PUBLICATIONS

Pigment Particle Size Using Microtrac Laser Technology Philip Planz Product Literature Application Note SL-AN-30 Revision A Sep. 23, 2008; Online Wayback evidence Sep. 3, 2013).*

*Primary Examiner* — Patrick Ryan
*Assistant Examiner* — Aaron Greso
(74) *Attorney, Agent, or Firm* — Oliff PLC

(57) ABSTRACT

A nickel composite hydroxide represented by $Ni_{1-x-y-z}Co_x Mn_y M_z(OH)_{2+A}$ (where $0 \le x \le 0.35$, $0 \le y \le 0.35$, $0 \le z \le 0.1$, $0 < x+y$, $0 < x+y+z \le 0.7$, $0 \le A \le 0.5$, with M being at least one of V, Mg, Al, Ti, Mo, Nb, Zr and W), a plate-shaped crystal core is generated by allowing a crystal core generating aqueous solution containing cobalt and/or manganese to have a pH value of 7.5 to 11.1 at a standard liquid temperature of 25° C., and slurry for the particle growth containing the plate-shaped crystal core is adjusted to a pH value of 10.5 to 12.5 at a standard liquid temperature of 25° C., while a mixed aqueous solution containing a metal compound containing at least nickel is being supplied thereto, so that the crystal core is grown as particles.

20 Claims, 7 Drawing Sheets

(51) Int. Cl.
*C01G 53/04* (2006.01)
*C01D 15/02* (2006.01)
*C30B 7/14* (2006.01)

(52) U.S. Cl.
CPC ............... *C01G 53/50* (2013.01); *C30B 7/14* (2013.01); *C01P 2004/03* (2013.01); *C01P 2004/20* (2013.01); *C01P 2004/32* (2013.01); *C01P 2004/50* (2013.01); *C01P 2004/51* (2013.01); *C01P 2004/54* (2013.01)

(58) Field of Classification Search
CPC .............. C01P 2004/50; C01P 2004/54; C01P 2004/20; C01P 2004/51; C01P 2004/03; C01P 2004/32; Y02E 60/122
See application file for complete search history.

(56) References Cited

FOREIGN PATENT DOCUMENTS

| | | | | |
|---|---|---|---|---|
| JP | 2000-323122 | * | 11/2000 | ............ H01M 10/40 |
| JP | 2008-147068 | * | 6/2008 | .............. H01M 4/58 |
| JP | 2010-015959 | * | 1/2010 | ............ H01M 4/525 |
| JP | 2011-116583 | * | 6/2011 | .............. C01G 53/00 |
| JP | 2012-084502 | * | 4/2012 | ............ H01M 4/525 |
| JP | A-2012-84502 | | 4/2012 | |
| WO | WO 00/21148 | * | 4/2000 | .............. H01M 2/16 |

* cited by examiner

NICKEL COMPOSITE HYDROXIDE AND METHOD FOR PRODUCING THE SAME, POSITIVE ELECTRODE ACTIVE MATERIAL AND METHOD FOR PRODUCING THE SAME AS WELL AS NONAQUEOUS ELECTROLYTIC SECONDARY CELL

BACKGROUND OF THE INVENTION

Field of the Invention

This invention relates to a nickel composite hydroxide that forms a precursor for a lithium nickel composite oxide for use as a positive electrode active material for a nonaqueous electrolytic secondary cell, such as, for example, a lithium ion secondary cell and a method for producing the same, and also concerns a positive electrode active material for a nonaqueous electrolytic secondary cell using the nickel composite hydroxide and a method for producing the same, as well as a nonaqueous electrolytic secondary cell in which the positive electrode is formed by using the positive electrode active material.

Description of the Related Art

In recent years, along with widespread use of portable apparatuses such as portable telephones and notebook personal computers, the development of a small-size, lightweight secondary cell having a high energy density has been strongly demanded. Such cells include a lithium ion secondary cell in which lithium, a lithium alloy, a metal oxide or carbon is used as a negative electrode, and this has been extensively studied and developed.

A lithium ion secondary cell using a lithium metal composite oxide, in particular, a lithium cobalt composite oxide that can be comparatively easily synthesized, has been expected as a cell having high energy density because of its capability of providing a high voltage of 4V level, and has been developed in its practical use. On the cell using the lithium cobalt composite oxide, various many developments for obtaining superior initial capacity characteristics and cycle characteristics have been carried out, and various achievements have already been obtained.

As positive electrode active materials that have been mainly proposed conventionally, the following materials are proposed: a lithium cobalt composite oxide ($LiCoO_2$) that is comparatively easily synthesized, a lithium nickel composite oxide ($LiNiO_2$) using nickel that is inexpensive than cobalt, a lithium nickel cobalt manganese composite oxide ($LiNi_{1/3}Co_{1/3}Mn_{1/3}O_2$), a lithium manganese composite oxide ($LiMn_2O_4$), or the like. For these, particles having spherical or virtually spherical shapes that are easily synthesized have been mainly used.

Main characteristics of a cell using such a positive electrode active material include a capacity and an output density. In particular, for cells for use in mounting on hybrid vehicles whose demands have remarkably increased in recent years, a high output density is required.

As a method for improving the output density, thinning the thickness of the electrode film is proposed. For example, the electrode having a thickness of about 50 μm is used for a hybrid vehicle. This is because when the thickness of the electrode film is made thinner, the transport distance of lithium ions can be reduced. The active material for use in such a thin electrode film is limited to particles having a small particle size with uniform particle sizes so as to prevent a possibility of penetrating the electrode film. In the case of an electrode film of about 50 μm, particles of about 5 μm are used.

However, in the case of using particles having a small particle size, since the electrode density is lowered, there is a disadvantage in that the volume energy density, which is an important characteristics in addition to the output density, is also lowered.

As a method for eliminating this trade-off relationship, the shape of positive electrode active material particles that is, in general, a spherical or virtually spherical shape, is changed. More specifically, forming the positive electrode active material particles into a plate shape is proposed. By forming the shape into a plate shape, the surface area is increased in comparison with that of spherical particles having the same volume, and by further orienting the plate-shaped particles upon forming the electrode, a high electrode density can be realized. Moreover, by orienting the particles having such a high aspect ratio, the thickness of the electrode can be made further thinner, and the output can be further improved.

As such plate-shaped positive electrode active material particles, for example, Patent Document 1 (Japanese Patent Application Laid-Open No. 2012-84502) has proposed plate-shaped particles for a positive electrode active substance that are disposed in a dispersed state inside an aggregate of a large number of (003) plane-oriented particles, each having a (003) plane oriented in a manner so as to be in parallel with the plate surface of the plate-shaped particles, which are lithium input/output surface oriented particles corresponding to primary crystal particles in which, supposing that a thickness is t, a particle diameter that is a dimension in a direction perpendicular to a thickness direction specifying the thickness t is d, and an aspect ratio is d/t, t≤30 μm and d/t≥2 are satisfied, each having a (003) plane oriented in a manner so as to intersect with the plate surface of the plate-shaped particles.

However, even in the case when a lithium input/output surface is oriented outside the secondary particle in this manner, adverse effects are given to the output characteristics when the contact of the positive electrode active material to the electrolytic solution is not sufficiently prepared. Moreover, although the rate characteristics has been described, no description has been given to the cell capacity itself that is an important characteristics of the cell characteristics.

As described above, it is difficult to industrially obtain a positive electrode active material that is capable of forming a thin electrode film having a high electrode density and has a high capacity with superior output characteristic.

In view of these problems, an object of the present invention is to provide a nickel composite hydroxide that can form a positive electrode active material for a nonaqueous electrolytic secondary cell capable of providing high output characteristic and cell capacity as well as achieving a high electrode density, when used as a positive electrode for a cell, and a production method for such a nickel composite hydroxide.

Moreover, another object of the present invention is to provide a positive electrode active material for a nonaqueous electrolytic secondary cell formed by using the nickel composite hydroxide and a production method thereof, and a nonaqueous electrolytic secondary cell using such a positive electrode active material.

The other object of the present invention is to provide an industrial production method for the nickel composite hydroxide and the positive electrode active material.

SUMMARY OF THE INVENTION

As a result of a detailed examination on a positive electrode active material for a nonaqueous electrolytic secondary cell having a shape capable of achieving a high electrode density and a nickel composite hydroxide serving as its precursor, the present inventors have found that by controlling crystallization conditions in association with the composition of the composite hydroxide serving as a precursor, secondary particles in which spherical or lump-shaped particles are two-dimensionally coupled to one another can be obtained.

Moreover, they also have found that by mixing this precursor with a lithium compound and then baking the mixture, a positive electrode active material that takes over the shape of the precursor can be obtained so that both of high output characteristics and cell capacity and a high electrode density can be achieved, thereby completing the present invention.

That is, a nickel composite hydroxide in accordance with the present invention has a composition represented by a general formula: $Ni_{1-x-y-z}Co_xMn_yM_z(OH)_{2+A}$ (where $0\leq x\leq 0.35$, $0\leq y\leq 0.35$, $0\leq z\leq 0.1$, $0<x+y$, $0<x+y+z\leq 0.7$ and $0\leq A\leq 0.5$, with M being at least one kind of additive element selected from the group consisting of V, Mg, Al, Ti, Mo, Nb, Zr and W), and in this structure, the nickel composite hydroxide is composed of secondary particles in which spherical or lump-shaped nickel composite hydroxide particles, which are formed by a plurality of primary particles aggregated with one after another, are coupled with one after another in two-dimensional directions, and the secondary particles are characterized by having a volume average particle size (Mv) of 4 to 20 μm measured by a laser diffraction/scattering method and a ratio (Mv/L) of the volume average particle size relative to the width (L) of the secondary particles in a direction perpendicular to the coupling direction of the nickel composite hydroxide particles in a range from 3 to 20.

The nickel composite hydroxide is preferably designed such that the nickel composite hydroxide has a deviation index [(D90−D10)/Mv] of particle size of 0.70 or less, which is calculated by using D90 and D10 in grain size distribution obtained by a laser diffraction/scattering method and the volume average particle size (Mv).

Moreover, the secondary particles preferably have a high concentration layer containing cobalt and/or manganese in a center in the width direction of each of the secondary particles, and the high concentration layer preferably has a thickness of 0.01 to 1 μm.

The nickel composite hydroxide can be used for a precursor of a positive electrode active material for a nonaqueous electrolytic secondary cell.

A method for producing the nickel composite hydroxide in accordance with the present invention is characterized by including the steps of: generating a plate-shaped crystal core by allowing a crystal core generating aqueous solution composed of a metal compound aqueous solution containing cobalt and/or manganese to have a pH value of 7.5 to 11.1 at a standard liquid temperature of 25° C.; and setting a pH value of slurry for a particle growth containing the plate-shaped core generated in the crystal core generating step to 10.5 to 12.5 at a standard liquid temperature of 25° C., while supplying a mixed aqueous solution including a metal compound containing at least nickel to slurry for the particle growth so as to carry out a particle growing step for growing the plate-shaped crystal core as particles.

The crystal core generating step preferably carries out a generation of the crystal core in a non-oxidizing atmosphere having an oxygen content of 5 volume % or less. Moreover, in the particle growing step, slurry for the particle growth preferably has an ammonia concentration of 5 to 20 g/l.

Slurry for the particle growth may be formed by adjusting the pH value of the plate-shaped crystal core containing slurry containing the plate-shaped crystal core obtained after completion of the crystal core generating step.

The positive electrode active material in accordance with the present invention is a positive electrode active material for use in a nonaqueous electrolytic secondary cell composed of a lithium nickel composite oxide represented by $Li_{1+u}Ni_{1-x-y-z}Co_xMn_yM_zO_2$ (where $-0.05\leq u\leq 0.50$, $0\leq x\leq 0.35$, $0\leq y\leq 0.35$, $0\leq z\leq 0.1$, $0<x+y$, $0<x+y+z\leq 0.7$, with M being at least one kind of additive element selected from the group consisting of V, Mg, Al, Ti, Mo, Nb, Zr and W), and in this structure, the lithium nickel composite oxide is composed of secondary particles in which spherical or lump-shaped lithium nickel composite oxide particles, which are formed by a plurality of primary particles aggregated with one another, are coupled to one after another in two-dimensional directions, and the secondary particles have the volume average particle size (Mv) of 4 to 20 μm measured by a laser diffraction/scattering method and a ratio (Mv/L) of the volume average particle size relative to the width (L) of the secondary particles in a direction perpendicular to the coupling direction of the lithium nickel composite oxide particles is set in a range from 3 to 20.

The positive electrode active material preferably has a specific surface area in a range from 0.3 to 2 $m^2/g$, and also preferably has a deviation index [(D90−D10)/Mv] of particle size of 0.75 or less, which is calculated by using D90 and D10 in grain size distribution obtained by a laser diffraction/scattering method and the volume average particle size (Mv).

Moreover, the positive electrode active material is preferably designed such that metal ions other than those of lithium of 3a site have a site occupation rate of 7% or less of metal ions and lithium ions of 3b site have a site occupation rate of 7% or less, obtained by Rietveld analysis of X-ray diffraction analysis, and the positive electrode active material also preferably has as an orientation index of a (003) plane of 0.9 to 1.1 obtained by an X-ray diffraction analysis.

The positive electrode active material preferably has a layer structure of a cubic crystal system.

A method for producing a positive electrode active material in accordance with the present invention is characterized by including the steps of: mixing the nickel composite hydroxide with a lithium compound so that a lithium mixed material is formed; and baking the lithium mixed material produced in the mixing step in an oxidizing atmosphere at a temperature of 650° C. to 980° C.

The lithium mixed material preferably has a ratio of the number of atoms of metals other than lithium contained in the lithium mixed material relative to the number of atoms of lithium in a range from 1:0.95 to 1.5.

Moreover, the method is preferably further provided with the step of: prior to the mixing step, carrying out a thermal treatment on the nickel composite hydroxide serving as a precursor at a temperature of 300 to 750° C. in a non-reducing atmosphere or in an air flow, and in this method, the oxidizing atmosphere in the baking step is preferably an atmosphere containing oxygen of 18 volume % to 100 volume %.

The nonaqueous electrolytic secondary cell in accordance with the present invention is provided with: a positive electrode, a negative electrode, a nonaqueous electrolyte and a separator, and characterized in that the positive electrode contains the above-mentioned positive electrode active material.

The present invention makes it possible to obtain a positive electrode active material capable of providing high output characteristics and cell capacity as well as achieving a high electrode density, when used as a positive electrode for a nonaqueous electrolytic secondary cell, and a nickel composite hydroxide that is desirably used as a precursor for the positive electrode active material. Moreover, by using the positive electrode active material for the nonaqueous electrolytic secondary cell, the present invention makes it possible to achieve both of high output characteristics and cell capacity, and consequently to obtain superior characteristics.

Furthermore, the present invention is easily put into practical use with high productivity, and applicable to production in industrial scale.

DETAILED DESCRIPTION OF THE PREFERRED EMBODIMENTS

Figure 1:
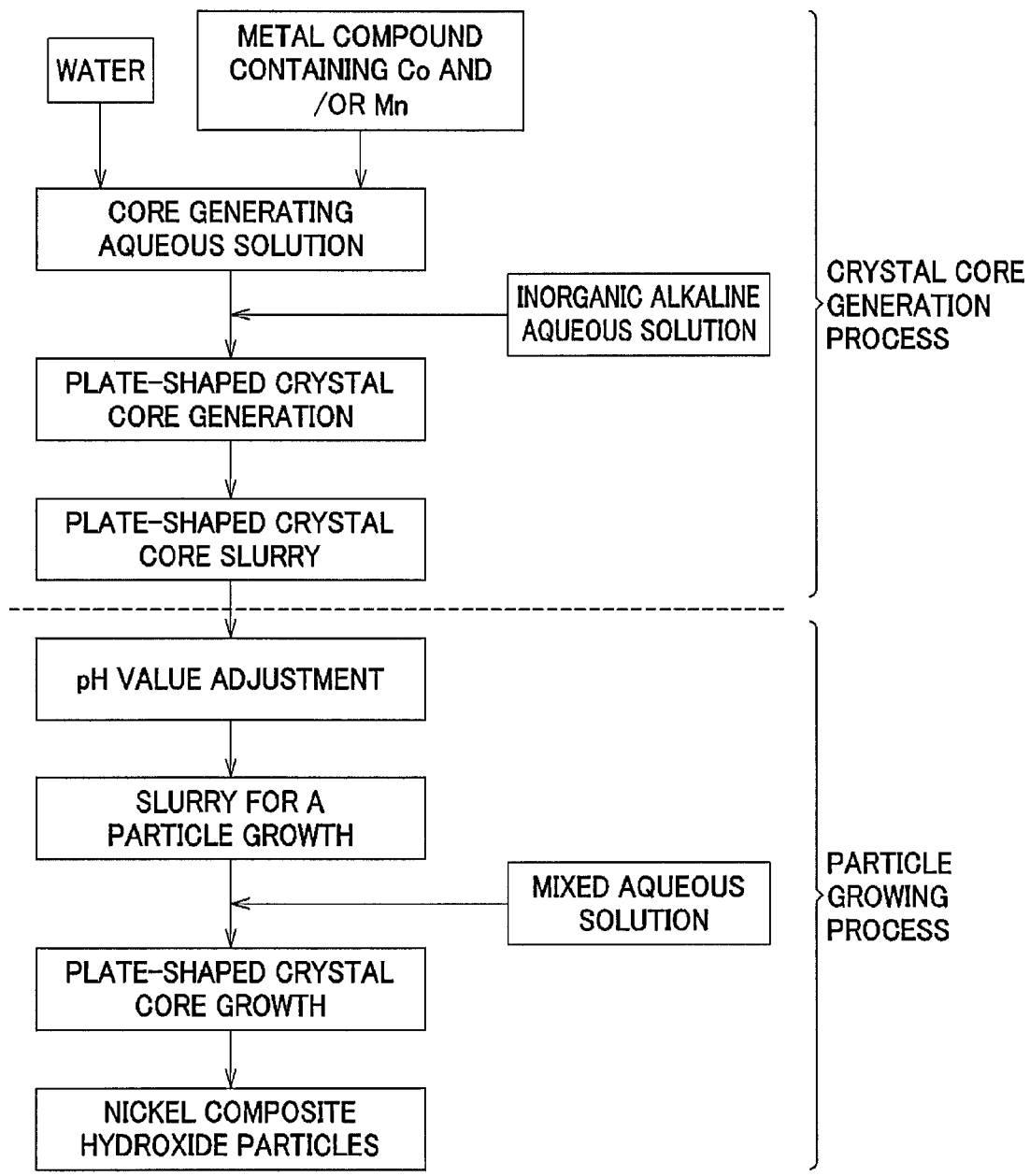
FIG. 1 is a flow chart that shows a production method for a nickel composite hydroxide to which the present invention is applied.

The following description will discuss specific embodiments relating to (1) a nickel composite hydroxide forming a raw material for a positive electrode active material for use in a nonaqueous electrolytic secondary cell (hereinafter, referred to simply as nickel composite hydroxide) and a production method thereof and a nickel composite oxide using the nickel composite hydroxide as its precursor and a production method thereof, (2) a positive electrode active material for use in a nonaqueous electrolytic secondary cell and a production method thereof, and (3) a nonaqueous electrolytic secondary cell using the positive electrode active material as its positive electrode, in detail. Moreover, the invention is not limited to the following-embodiments, but that various changes may be made within the scope of not departing from the gist of the invention.

The embodiments of the present invention will be explained in detail in the following order.
[1] Nickel composite hydroxide and production method thereof
[2] Positive electrode active material for nonaqueous electrolytic secondary cell and production method thereof
[3] Nonaqueous electrolytic secondary cell
[1] Nickel Composite Hydroxide and Production Method Thereof
<1-1> Nickel Composite Hydroxide A nickel composite hydroxide in accordance with the present embodiment is prepared as secondary particles in which spherical or lump-shaped nickel composite hydroxide particles (hereinafter, referred to as constitutive particles), which are formed by a plurality of primary particles aggregated with one after another, are coupled with one after another in two dimensional directions. These secondary particles have the volume average particle size (Mv) of 4 to 20 μm measured by a laser diffraction/scattering method and a ratio (Mv/L) of the volume average particle size relative to the width (L) of the secondary particles in a direction perpendicular to the coupling direction of the nickel composite hydroxide particles in a range from 3 to 20.

As a result of examinations by the present inventors on the filling density and the contact area to an electrolytic solution, it has been found that by using secondary particles composed of spherical or lump-shaped particles coupled to one after another in two-dimensional directions, both of the improvement of the filling density and an increased contact area to an electrolytic solution can be achieved. That is, it has been found that by using secondary particles composed of spherical or lump-shaped particles coupled to one after another in two-dimensional directions, effects of an increased contact area to an electrolytic solution by the use of small-size particles and an improved filling density by the use of plate-shaped particles can be simultaneously obtained.

(Particle Shape•Structure)

It is important for the nickel composite hydroxide in accordance with the present invention to be composed of secondary particles in which nickel composite hydroxide particles serving as constitutive particles, which are formed by a plurality of primary particles aggregated with one after another, are coupled to one after another in two-dimensional directions. The shape of positive electrode active material particles is derived from the shape of the precursor thereof. Therefore, by controlling the shape of the precursor particles into a shape of the secondary particles composed of constitutive particles coupled to one after another in two-dimensional directions, it is possible to also form the shape of the resulting positive electrode active material particles into a shape having the same characteristics. Additionally, in the case when small-particle-size or plate shaped precursor particles are used in conventional manner, it is not possible to obtain a positive electrode material having the above-mentioned shape.

Moreover, the nickel composite hydroxide has the volume average particle size (Mv) of 4 to 20 μm measured by a laser diffraction/scattering method and a ratio (Mv/L) of the volume average particle size relative to the width (L) of the secondary particles in a direction perpendicular to the coupling direction of the nickel composite hydroxide particles in a range from 3 to 20. Furthermore, the width (L) of secondary particles of the nickel composite hydroxide is preferably set to 1 to 5 μm. In the case when Mv, Mv/L and L (hereinafter, referred to also as shape specific values), which specify the shape of the nickel composite hydroxide, exceed the respective ranges, since the shape specific values of the resulting positive electrode active material might also deviate from the respective ranges, it becomes impossible to obtain high output characteristics and cell capacity as will be described later and consequently to obtain a high electrode density. Therefore, in the nickel composite hydroxide, the shape specific values (Mv, Mv/L and L) need to be set within the respective ranges.

In this case, the width (L) of the secondary particles is obtained by processes in which the cross section of each of the nickel composite hydroxide particles is observed by a scanning electron microscope and the largest diameters of three or more particles in a vertical direction relative to the coupling direction of coupled spherical or lump-shaped particles are measured and averaged so that the width (L) of the each secondary particle is found. Then, by averaging 20 or more secondary particles, the width (L) of the secondary particles is obtained.

In the case when the nickel composite hydroxide is composed of constitutive particles derived from a plurality of primary particles aggregated with one after another, virtually uniform voids are generated inside the constitutive particles. With this structure, when, upon preparing the positive electrode active material, the nickel composite hydroxide and a lithium compound are mixed and baked, the melted lithium compound is delivered inside the constitutive particles so that the diffusion of lithium is sufficiently carried out to obtain a positive electrode active material having good crystallinity. In order to provide better crystallinity, it is preferable to allow the primary particles to be aggregated in random directions.

Moreover, in accordance with the production method of the present invention, the nickel composite hydroxide is allowed to have a plate-shaped high concentration layer containing cobalt and/or manganese and expanding in a coupling direction of the secondary particles inside the secondary particles. The nickel composite hydroxide is formed by growing plate-shaped crystal cores generated from a metal compound containing cobalt and/or manganese. Therefore, the high concentration layer of cobalt and/or manganese derived from the plate-shaped crystal cores is located inside the resulting nickel composite hydroxide, that is, in the center portion in the width direction of the nickel composite hydroxide. By growing the plate-shaped crystal cores to such a degree as to form the high concentration layer, it is possible to develop the secondary particles into a desired shape. In contrast, in the case when no high concentration layer exists, this case corresponds to an undeveloped state of the plate-shaped crystal cores, sometimes failing to allow the resulting secondary particles to have a desired shape. However, as long as plate-shaped particles have such a degree of strength as not to be destroyed during the crystal growth and also have the shape similar to the plate-shaped crystal core, these can be used as the plate-shaped crystal core to develop secondary particles; therefore, in the case when a nickel composite hydroxide is obtained by preparing plate-shaped particles having desired composition and shape in a separate manner, such a nickel composite hydroxide without the high concentration layer can be obtained.

In order to allow the secondary particles to have a sufficient shape, the thickness of the high concentration layer is preferably set o 0.01 to 1 μm. In the case when the thickness is less than 0.01 μm, the plate-shaped crystal cores are destroyed during the core forming process or the particle growing process, the coupling in the secondary direction tends to sometimes become insufficient. In contrast, in the case when the thickness exceeds 1 μm, the resulting positive electrode active material tends to have a composition that is uneven inside the particles, or fails to have a composition set within a predetermined range.

With respect to the growth of crystals from the plate-shaped crystal cores, since a concavity can be formed on the grain boundary of the spherical or lump-shaped particles on the two surfaces by developing the crystals onto two surfaces of the plate shaped core, it is preferable to form the high concentration layer in a direction perpendicular to the coupling direction of secondary particles, that is, in the center portion in the width direction. That is, it is preferable to allow particles to grow from the high concentration layer in two surface directions with a spherical shape or a lump shape.

(Composition)

The nickel composite hydroxide relating to the present embodiment has a composition represented by a general formula (1): $Ni_{1-x-y-z}Co_xMn_yM_z(OH)_{2+A}$ (in the case, $0 \leq x \leq 0.35$, $0 \leq y \leq 0.35$, $0 \leq z \leq 0.1$, $0 < x+y$, $0 < x+y+z \leq 0.7$, $0 \leq A \leq 0.5$, with M being at least one kind of additive element selected from the group consisting of V, Mg, Al, Ti, Mo, Nb, Zr and W).

The nickel composite hydroxide contains at least either cobalt or manganese as described above. In general formula (1), x+y representing the total amount of these satisfies $0 < x+y$, and in order to sufficiently develop the plate-shaped crystal cores, it is preferable to satisfy $0.05 \leq x+y$, and more preferable to satisfy $0.1 \leq x+y$.

In the case when a positive electrode active material is obtained by using the above-mentioned nickel composite hydroxide as a raw material, the composition ratio (Ni:Mn:Co:M) of the composite hydroxide is maintained in the resulting positive electrode active material. Therefore, the composition ratio of the nickel composite hydroxide particles is set in the same manner as in the composition ratio required for a positive electrode active material to be obtained. By using the composition ratio shown in general formula (1), when the resulting positive electrode active material for a nonaqueous hydrolytic secondary cell is used for a cell, the resulting cell is allowed to exert superior cell performances.

(Grain Size Distribution)

The nickel composite hydroxide is preferably designed to have a deviation index [(D90−D10)/Mv] of particle size of 0.70 or less, which is calculated by using D90 and D10 in grain size distribution obtained by the laser diffraction/scattering method and the volume average particle size (Mv).

The grain size distribution of the positive electrode active material is greatly influenced by the nickel composite hydroxide for use as a raw material; therefore, when fine particles and bulky particles are mixed into the nickel composite hydroxide, the same particles are also present in the positive electrode active material. That is, when the deviation index of the nickel composite hydroxide exceeds 0.70 with a widely scattered state of the grain size distribution, fine particles or bulky particles tend to also exist in the positive electrode active material.

In the case when the positive electrode is formed by using a positive electrode active material containing many fine particles, since heat might be generated due to local reactions of the fine particles, the stability of the cell is lowered, and since the fine particles tend to deteriorate selectively, the cycle characteristics of the cell deteriorate. In contrast, in the case when the positive electrode is formed by using a positive electrode active material containing many bulky particles, it is not possible to provide a sufficient reaction area between the electrolytic solution and the positive electrode active material, resulting in a reduction of the cell output due to an increase of reaction resistance.

Therefore, by setting the deviation index of the nickel composite hydroxide to 0.70 or less, it is possible to make the deviation index of the resulting positive electrode active material smaller and consequently to improve the cycle characteristics and output characteristics. Although the characteristics of the positive electrode active material can be improved by making the deviation index smaller, it is difficult to completely suppress deviations of particle sizes, and the lower limit of the actual deviation index is actually set to about 0.30.

In the deviation index [(D90–D10)/Mv] of particle sizes, with respect to D10, by accumulating the numbers of particles in respective particle sizes from the smaller side of the particle sizes and finding the particle size of particles whose accumulated volume corresponds to 10% of the total volume so that the resulting particle size is defined as D10. Moreover, with respect to D90, by accumulating the numbers of particles in the same manner and finding the particle size of particles whose accumulated volume corresponds to 90% of the total volume so that the resulting particle size is defined as D90. The volume average particle size Mv, D90 and D10 can be obtained by measurements using a laser light diffraction/scattering type particle size analyzer.

<1-2> Production Method for Nickel Composite Hydroxide

In a production method for the above-mentioned nickel composite hydroxide, a nickel composite hydroxide represented by the following general formula (1) is produced by a crystallization reaction: $Ni_{1-x-y-z}Co_xMn_yM_z(OH)_{2+A}$ (in the case, $0 \leq x \leq 0.35$, $0 \leq y \leq 0.35$, $0 \leq z \leq 0.1$, $0 < x+y$, $0 < x+y+z \leq 0.7$, $0 \leq A \leq 0.5$, with M being at least one kind of additive element selected from the group consisting of V, Mg, Al, Ti, Mo, Nb, Zr and W).

<1-2-1> Crystal Core Generation Process•Particle Growing Process

As shown in FIG. 1, the production method for a nickel composite hydroxide includes a crystal core generation process for generating a plate-shaped crystal core from a metal compound containing cobalt and/or manganese and a particle growing process for growing the plate-shaped crystal core formed in the crystal core generation process.

In this case, in a conventional crystallization process, a core generating reaction and a particle growing reaction are simultaneously carried out in the same vessel. For this reason, in the conventional crystallization method, the resulting composite hydroxide particles are subjected to an isotropic growth, making it difficult to control the particle shape.

In contrast, the production method for a nickel composite hydroxide in accordance with the present embodiment is provided with a crystal core generation process in which a plate-shaped crystal core is generated mainly by a core generating reaction and a particle growing process in which particles are grown mainly from the two surfaces of the plate-shaped crystal core, which are carried out in a clearly separated manner. Thus, in accordance with the production method for a nickel composite hydroxide of the present embodiment, the particle shape of the resulting nickel composite hydroxide can be controlled. As the method for separating the processes, as will be described later, a method in which the pH value of the crystal core generation process and the pH value of the particle growing process are changed from each other and a method in which the reaction vessel of the crystal core generation process and the reaction vessel of the particle growing process are changed from each other, for example, proposed.

(Crystal Core Generation Process)

In the crystal core generation process, by mixing an inorganic alkaline aqueous solution in a core generating aqueous solution obtained by dissolving a metal compound containing cobalt and/or manganese in water at a predetermined ratio, the pH value is adjusted to 7.5 to 11.1 at a standard liquid temperature of 25° C., and the plate-shaped crystal core is then generated.

In the core generation process, by using a hydroxide of cobalt and/or manganese, the pH value of the core generating aqueous solution is adjusted so that the crystal core made of the hydroxide of cobalt and/or manganese is formed and the crystal core is formed into a plate shap.

The crystal core may contain a metal element other than cobalt and/or manganese. In this case, in order to allow the core to develop into the plate shape, the content of cobalt and/or manganese contained in the crystal core is preferably made to exceed 70 mole % relative to the total metal elements, and more preferably, made to exceed 80 mole % or more. In order to sufficiently develop the plate-shaped crystal core, it is preferable to use the crystal core made of only a hydroxide composed of cobalt and/or manganese.

The metal composition ratio of the plate-shaped crystal core is the same as the composition ratio of the respective metals in a core generating aqueous solution. Therefore, by adjusting the ratio of metal compounds (metal salts) to be dissolved in water so as to allow the composition ratio of metals in the core generating aqueous solution to form the same composition ratio as the composition ratio of cobalt and manganese in the plate-shaped crystal core to be generated, the core forming aqueous solution is prepared so that a plate-shaped crystal core having a target composition ratio can be obtained.

In the crystal core generation process, first, by dissolving metal compounds containing cobalt and/or manganese to be described later in detail into water so as to have a desired metal composition, a core generating aqueous solution is prepared.

Next, by adding an inorganic alkaline aqueous solution to the core generating aqueous solution thus formed, the pH value of the core generating aqueous solution is adjusted to 7.5 to 11.1 at a standard liquid temperature of 25° C. The pH value of the core generating aqueous solution can be measured by a generally used pH meter.

In the crystal core generation process, by setting the composition of the core generating aqueous solution to a desired composition, with the pH value thereof being set to 7.5 to 11.1 at a liquid temperature of 25° C., a core is developed into a plate shape so that the generation of a plate-shaped crystal core is preferentially carried out. Thus, in the crystal core generation process, the plate-shaped crystal core of a composite hydroxide containing cobalt and/or manganese is generated in the core generating aqueous solution, thereby making it possible to obtain a slurry containing the plate-shaped crystal core.

Figure 2:
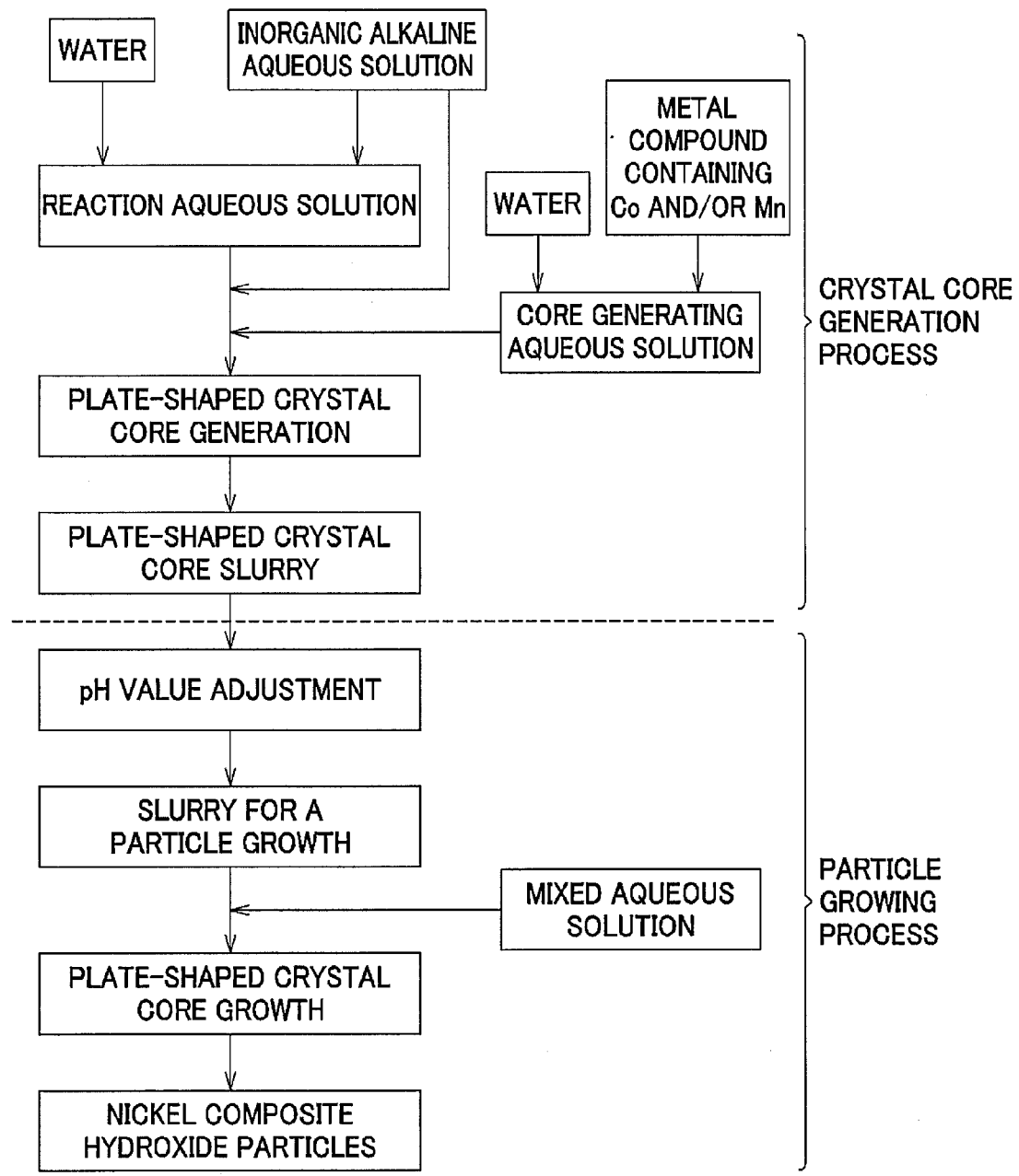
FIG. 2, which also shows a production method for a nickel composite hydroxide, is a flow chart of a production method that differs from the production method shown in FIG. 1 in a crystal core forming process.

The crystal core generation process is not limited by the method shown in FIG. 1, and for example, a method shown in FIG. 2 may be used. In the crystal core generation process shown in FIG. 1, by directly adding the inorganic alkaline aqueous solution to the core generating aqueous solution, the plate-shaped crystal core is generated.

In contrast, in the crystal core generation process shown in FIG. 2, a solution prepared by preliminarily adding water to the inorganic alkaline aqueous solution so as to adjust its pH value to 7.5 to 11.1 is used as a reaction aqueous solution, and with the reaction aqueous solution being stirred in a reaction vessel, the core generating aqueous solution is supplied thereto, and a plate-shaped crystal core is generated, while the pH value is being maintained by adding the inorganic alkaline aqueous solution thereto, so that a plate-shaped crystal core slurry is obtained. The method for supplying the core generating aqueous solution, with the pH value of the reaction aqueous solution being maintained, makes it possible to strictly control the pH value and also to easily generate the plate-shaped crystal core; thus, this method is preferably used.

In the crystal core generation processes shown in FIG. 1 and FIG. 2, when crystal cores of a predetermined amount have been formed in the plate-shaped crystal core slurry by the core generating aqueous solution and the inorganic alkaline aqueous solution, the crystal core generation process is completed. It is determined whether or not crystal cores of the predetermined amount have been generated based upon the amount of the metal salt added to the core generating aqueous solution.

In order to obtain nickel composite hydroxide particles, with the aforementioned shape specific values being set within respective ranges, although not particularly limited, the amount of crystal cores generated in the crystal core generation process is preferably set to 0.1% or more to 2% or less, more preferably to 0.1% or more to 1.5% or less of the total amount, that is, the total metal salt to be supplied to obtain nickel composite hydroxide particles.

(Particle Growing Process)

Next, the sequence proceeds to a particle growing process. In the particle growing process, after completion of the crystal core generation process, by adjusting the pH value of the plate-shaped crystal core slurry in the reaction vessel to 10.5 to 12.5, more preferably, to 11.0 to 12.0, at a standard liquid temperature of 25° C., slurry for the particle growth in the particle growing process is obtained. More specifically, the pH value is controlled by adjusting the amount of supply of the inorganic alkaline aqueous solution. Additionally, the particle growing processes shown in FIG. 1 and FIG. 2 are carried out in the same method.

In the particle growing process, a mixed aqueous solution containing a metal compound containing at least nickel is supplied to slurry for the particle growth. The mixed aqueous solution is allowed to contain a metal compound containing cobalt, manganese or an added element, if necessary, in addition to a metal compound containing nickel, so as to obtain a nickel composite hydroxide having a predetermined composition ratio. The metal composition ratio of primary particles that grow on the two surfaces of the plate-shaped crystal core in the particle growing process becomes the same as the composition ratio of the respective metals in the mixed aqueous solution. Therefore, adjustments are made so that the total of the metal salt used in the crystal core generation process and the metal salt in the mixed aqueous solution used in the particle growing process corresponds to the composition ratio of the respective metals in the nickel composite hydroxide.

In the particle growing process, by setting the pH value of slurry for the particle growth in a range from 10.5 to 12.0, more preferably, from 11.0 to 12.0, at a standard liquid temperature of 25° C., the growing reaction of the crystal core is more preferentially taken place than the generating reaction of the crystal core. Thus, in the particle growing process, hardly any new cores are generated in slurry for the particle growth in the particle growing process, with the plate-shaped crystal core being grown as particles.

In the particle growing process, in order to allow the nickel composite hydroxide to be generated to have the composition shown in the aforementioned general formula (1), the content of cobalt and/or manganese in the mixed aqueous solution becomes smaller than that of the core generating aqueous solution, with the result that primary particles fail to develop into a plate shape. Consequently, the primary particles are grown as particles on the plate surface (two surfaces) of the plate-shaped crystal core so that a nickel composite hydroxide particle in which the width (L) of spherical or lump-shaped secondary particles having a high concentration layer containing cobalt and/or manganese in its center portion is grown to a predetermined value can be obtained.

Since the pH value of slurry for the particle growth changes together with the particle growth by the supply of the mixed aqueous solution, the pH value of slurry for the particle growth is controlled to be maintained in a range from 10.5 to 12.5 at a standard liquid temperature of 25° C., by also supplying the inorganic alkaline aqueous solution to slurry for the particle growth in addition to the mixed aqueous solution.

Thereafter, at the point of time when the nickel composite hydroxide particles are grown to have a predetermined particle size, the particle growing process is completed. By carrying out preliminarily tests so that a relationship between the amount of addition of metal salts for use in the respective processes of the crystal core generation process and the particle growing process and the resulting particles through preliminary tests is obtained, the particle size of the nickel composite hydroxide particles can be easily determined from the amount of addition of metal salts in the respective processes.

As described above, in the production method for a nickel composite hydroxide, the generation of a plate-shaped crystal core is preferentially carried out in the crystal core generation process, and in the particle growing process thereafter, only the particle growth over the two surfaces of the plate-shaped crystal core, that is, in the width (L) direction of secondary particles to be generated, is carried out, with hardly any new crystal core is generated. Thus, in the crystal core generation process, a uniform plate-shaped crystal core is formed, and in the particle growing process, the plate-shaped crystal core can be uniformly grown as particles. Therefore, in the above-mentioned production method for a nickel composite hydroxide, it becomes possible to obtain uniform nickel composite hydroxide particles which are controlled so as to have a predetermined shape with a narrow grain size distribution.

Additionally, in the production method for a nickel composite hydroxide, in both of the processes, since metal ions are crystallized as plate-shaped cores or composite hydroxide particles, the ratio of the liquid component relative to the metal component in each of the slurries increases. In this case, since, in appearance, the concentration of the metal salt to be supplied is lowered, there is a possibility of the composite hydroxide particles failing to sufficiently grow, in particular, in the particle growing process.

Therefore, in order to suppress the increase of the liquid component, it is preferable to carry out a discharging operation of one portion in the liquid component of slurry for the particle growth outside the reaction vessel during the point of completion of the crystal core forming process and the point of the particle growing process. More specifically, supplies of the inorganic alkaline aqueous solution and the mixed aqueous solution and stirring processes for these relative to slurry for the particle growth are temporarily stopped so that the plate-shaped crystal cores and the nickel composite hydroxide particles are precipitated, and the supernatant liquid of slurry for the particle growth is discharged. Thus, the relative concentration of the mixed aqueous solution in slurry for the particle growth can be raised. Moreover, since the nickel composite hydroxide particles can be grown with the relative concentration of the mixed aqueous solution being kept in a high level, the grain size distribution of the nickel composite hydroxide particles can be further narrowed so that the density of the secondary particles of the nickel composite hydroxide particles as a whole can be increased.

Moreover, in the core growing process shown in FIG. 1 and FIG. 2, since by adjusting the pH value of the plate-shaped crystal core slurry obtained in the crystal core generation process, slurry for the particle growth is obtained and the particle growing process is successively carried out from the crystal core generation process, the shift to the particle growing process is advantageously carried out. Moreover, the shift from the crystal core generating process to the particle growing process can be carried out only by adjusting the pH value of the plate-shaped crystal core slurry, and the adjustment of the pH value is also advantageously carried out easily by temporarily stopping the supply to the inorganic alkaline aqueous solution or, in the case of using the same kind of inorganic acid as the acid forming the metal compound, for example, in the case of using a sulfuric salt, by only adding sulfuric acid into the plate-shaped crystal core slurry.

Figure 3:
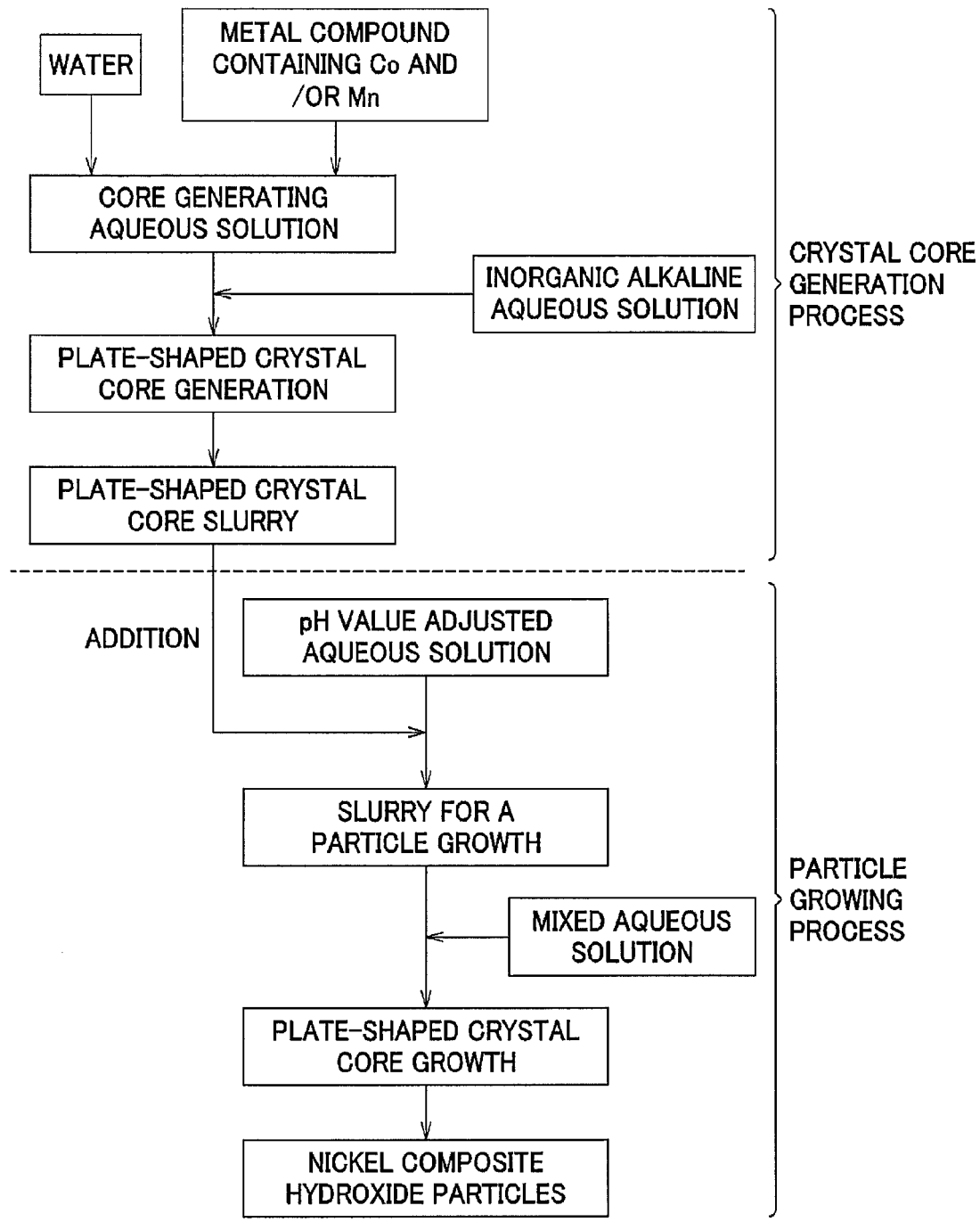
FIG. 3, which also shows a production method for a nickel composite hydroxide, is a flow chart of a production method that differs from the production method shown in FIG. 1 in a particle growing process.

In this case, the particle growing process is not limited by the method shown in FIG. 1 and FIG. 2, and a method shown in FIG. 3 may be used. In a crystal core generation process shown in FIG. 3, in the same manner as in the crystal core generation process shown in FIG. 1, the resulting particles can be obtained by directly adding the inorganic alkaline aqueous solution to the core generating aqueous solution, or in the same manner as in the core generation process shown in FIG. 2, the resulting particles can be obtained by stirring the reaction aqueous solution while adjusting the pH value, with the core generating aqueous solution being supplied thereto.

In the particle growing process shown in FIG. 3, in a separate manner from the plate-shaped crystal core slurry, a pH value adjusted aqueous solution is formed in which an adjusted pH value suitable for the particle growing process is prepared by the use of the inorganic alkaline aqueous solution. Moreover, to this pH value adjusted aqueous solution, a plate-shaped crystal core slurry prepared by carrying out a core generation process in another reaction vessel, preferably, a slurry prepared by removing one portion of the liquid component of the plate-shaped crystal core slurry as described above is added so that slurry for the particle growth is formed. By using this slurry for the particle growth, a particle growing process is carried out in the same manner as in the particle growing process shown in FIG. 1 and FIG. 2.

In the production method for a nickel composite hydroxide shown in FIG. 3, since the separation between the crystal core generation process and the particle growing process can be positively prepared, the states of the reaction aqueous solutions in the respective processes can be set to optimal conditions for the respective processes. In particular, the pH value of slurry for the particle growth can be set to the most suitable conditions from the starting point of the particle growing process. The nickel composite hydroxide obtained in the particle growing process is allowed to have a narrower range in grain size distribution with a uniform structure.

<1-2-2> Control of pH and Reaction Atmosphere, Particle Size, Mv/L Ratio and Ammonia Concentration Next, the following description will explain the control of pH and reaction atmosphere, the particle size of nickel composite hydroxide, Mv/L ratio and the ammonia concentration in detail.

(pH Control in Crystal Core Generation Process)

As described above, in the crystal core generation process shown in FIGS. 1 to 3, it is necessary to control the pH value of the core generating aqueous solution so as to be set in a range from 7.5 to 11.1 at a standard liquid temperature of 25° C. In the case when the pH value at the standard liquid temperature of 25° C. is less than 7.5, metal compounds remain in the liquid, failing to generate a sufficient amount of plate-shaped crystal cores. Moreover, in the case when the pH value exceeds 11.1, the crystal core generation of those having a spherical shape becomes more predominant than that of those having a plate shape, failing to sufficiently generate plate-shaped crystal cores suitable for obtaining the nickel composite hydroxide particles in accordance with the present embodiment. In other words, in the crystal core generation process, by setting the pH value of the core generating aqueous solution in a range from 7.5 to 11.1, it becomes possible to sufficiently generate the plate-shaped crystal cores.

(pH Control in Particle Growing Process)

In the particle growing process, it is necessary to control the pH value of slurry for the particle growth so as to be set in a range from 10.5 to 12.5, more preferably, from 11.0 to 12.0, at a standard liquid temperature of 25° C. In the case when the pH value at the standard liquid temperature of 25° C. is less than 10.5, more impurities, for example, anionic constitutive elements contained in metal salts, etc. tend to be contained in the resulting nickel composite hydroxide. Moreover, in the case when the pH value exceeds 12.5, new spherical crystal cores are generated in the particle growing process to cause a reduction in the ratio of the plate-shaped particles, resulting in subsequent degradation of the grain size distribution. That is, in the particle growing process, by controlling the pH value of slurry for the particle growth in a range from 10.5 to 12.5, only the growth of the plate-shaped crystal cores generated in the crystal core generation process is preferentially exerted, with new crystal core generation being suppressed, so that the resulting nickel composite hydroxide has a uniform structure with a narrowed range in grain size distribution and a well controlled shape.

In both of the crystal core generation process and the particle growing process, the pH fluctuation width is preferably set to within 0.2 from the upper and lower set values. In the case when the pH fluctuation width is large, the crystal core generation and the particle growth fail to become constant, sometimes making it impossible to obtain uniform nickel hydroxide particles with a narrowed range in grain size distribution.

(Reaction Atmosphere of Crystal Core Generation Process)

In the crystal core generation process, the crystal core generation is preferably carried out in a non-oxidizing atmosphere with an oxygen concentration of 5 volume % or less. With this arrangement, oxidation of cobalt and manganese is suppressed so that the generation of plate-shaped single crystal hydroxide is accelerated to develop plate-shaped crystal cores. In the case when the oxygen concentration exceeds 5 volume %, spherical or lump-shaped cores are formed by fine aggregated crystals, sometimes failing to obtain plate-shaped cores. The non-oxidizing atmosphere is defined by an oxygen concentration in an atmosphere made in contact with the aqueous solution or the plate-shaped crystal core slurry during the crystal core formation. In an attempt to develop the crystal cores into a plate shape, it is preferable to set the oxygen concentration to 2 volume % or less, and it is more preferably to set the oxygen concentration to 1 volume % or less.

(Reaction Atmosphere of Particle Growing Process)

In the particle growing process also, in the case of an oxidizing atmosphere, primary particles to be grown on the plate-shaped crystal core become fine to sometimes cause a failure in obtaining minute nickel composite hydroxide particles. Therefore, the atmosphere at the time of growing particles, that is, the atmosphere made in contact with slurry for the particle growth, is preferably set to an atmosphere with an oxygen concentration of 10 volume % or less, and in the same manner as in the crystal core forming process, the oxygen concentration is more preferably set to 2 volume % or less.

In the respective processes, as a means for maintaining the inner space of the reaction vessel in the above-mentioned reaction atmosphere, a process for allowing an inert gas such as nitrogen to flow into the inner space of the reaction vessel and a process for further forming bubbles of the inert gas in the reaction vessel are proposed.

(Particle Size of Nickel Composite Hydroxide and Control of Secondary Particle Width)

Since the volume average particle size (Mv) of the generated nickel composite hydroxide is correlated with the size of the plate-shaped core, it can be controlled by adjusting the reaction atmosphere, the stirring force and the like of the crystal core generation process. By suppressing oxidation with the stirring process being weakened, the plate-shaped crystal core can be developed.

The width (L) of the secondary particles can be controlled by the period of time of the particle growing process; therefore, by continuously carrying out the particle growing process until a desired width has been achieved by the growth, it is possible to obtain nickel composite hydroxide particles with a desired width. That is, by controlling the volume average particle size in the crystal core generation process and also by adjusting the width of the secondary particles in the particle growing process, the ratio of Mv/L can be controlled to 3 to 20.

(Ammonia Concentration)

To slurry for the particle growth in the particle growing process, ammonia is preferably added as a complexing agent. The ammonia concentration in slurry for the particle growth in the particle growing process is preferably controlled to 5 to 20 g/l. Since ammonia functions as the complexing agent, the solubility of metal ions is not kept constant when the ammonia concentration is less than 5 g/l, primary particles that develop on the plate-shaped crystal core become ununiform, sometimes causing deviations in the width of secondary particles. Moreover, since no plate-shaped crystal cores are generated, fine gel-state cores tend to be easily generated, with the result that the grain size distribution is easily widened.

In the case when the ammonia concentration exceeds 20 g/L, the solubility of metal ions becomes too high and causes an increase in the amount of metal ions remaining in slurry for the particle growth, with the result that deviations or the like in the composition sometimes tend to occur.

Moreover, when the ammonia concentration fluctuates, the solubility of metal ions also fluctuate, and since uniform nickel composite hydroxide particles are not formed, it is preferable to maintain the concentration at a constant value. For example, the fluctuations in the ammonia concentration are preferably maintained at a desired concentration with a width of an increase or a decrease being set to about 5 g/L relative to the set concentration.

With respect to a supply body for ammonium ions, although not particularly limited, for example, ammonia, ammonium sulfate, ammonium chloride, ammonium carbonate, ammonium fluoride, etc., may be used.

<1-2-3> Metal Compound to be Used, Reaction Conditions, Etc.

Next, the following description will explain a metal compound (metal salt) to be used and conditions such as a reaction temperature or the like. Additionally, differences in these conditions between the crystal core generation process and the particle growing process are only the above-mentioned pH value and the range in which compositions of the core generating aqueous solution and the mixed aqueous solution are controlled, and conditions such as metal compounds, reaction temperatures, etc. are virtually the same in both of the processes.

(Metal Compound)

As the metal compound, a compound containing a target metal is used. The compound to be used is preferably a water soluble compound, and metal salts, such as nitric salts, sulfuric salts, hydrochloride, etc. are proposed. For example, nickel sulfate, manganese sulfate and cobalt sulfate are preferably used.

(Additive Elements)

As the additive element in general formula (1) (at least one kind of additive element selected from the group consisting of V, Mg, Al, Ti, Mo, Nb, Zr and W), a water soluble compound is preferably used, and examples thereof include vanadium sulfate, ammonium vanadate, magnesium sulfate, aluminum sulfate, titanium sulfate, peroxoammonium titanate, potassium titanium oxalate, zirconium sulfate, zirconium nitrate, niobium oxalate, ammonium molybdate, sodium tungstate, ammonium tungstate, etc.

The addition of the additive element may be carried out by adding an additive containing the additive element to a core generating aqueous solution or a mixed solution thereof so as to coprecipitate in a state where the additive element is uniformly dispersed inside composite hydroxide particles.

The additive element may also be added by coating the surface of each of the resulting nickel composite hydroxide particles with a compound containing the additive element. Additionally, in the case when the surface is coated with the additive element, the atomic ratio of the additive element ions that are present upon forming the composite hydroxide particles by crystallization is made smaller by the amount corresponding to element ions to be coated so that the atomic ratio of the metal ions of the nickel composite hydroxide can be made coincident with the final composition ratio. Moreover, the process of coating the surface of each of the nickel composite hydroxide particles with the additive element may be carried out on the particles of the composite hydroxide that has been subjected to a heating process.

(Concentration of Mixed Aqueous Solution in Particle Growing Process)

The concentration of the mixed aqueous solution is preferably set to 1.0 to 2.6 mol/L, more preferably, to 1.5 to 2.2 mol/L in total of the metal compounds. In the case when the concentration of the mixed aqueous solution is less than 1.0 mol/L, since the amount of crystallization per reaction vessel becomes smaller, this state is not preferable because of a reduction of productivity.

On the other hand, in the case when the concentration of the mixed aqueous solution exceeds 2.6 mol/L, since the saturated concentration at normal temperature is exceeded, crystals are re-crystallized to cause such a risk as to clog plug pipes of the facilities.

Moreover, with respect to the mixed aqueous solution, it is not necessarily required to supply all the metal compounds that are needed for the reaction to the reaction vessel as the mixed aqueous solution. For example, in the case when a metal compound that generates a compound caused by a reaction when mixed, the metal compounds in the aqueous solution are individually adjusted so as to set the total concentration of all the metal compounds in the aqueous solution to 1.0 to 2.6 mol/L, and metal compound aqueous solutions are individually prepared, and then the individual aqueous solutions of the metal compounds may be simultaneously supplied to the reaction vessel at a predetermined ratio.

(Reaction Solution Temperatures of Crystal Core Generation Process and Core Growing Process)

The liquid temperature of the reaction solution at the time of a reaction is preferably set to 20° C. or more, more preferably, to 20 to 70° C. In the case when the liquid temperature is 20° C. or less, since the solubility becomes low and easily causes generation of cores, making it difficult to control. In contrast, in the case of the liquid temperature exceeding 70° C., since upon addition of ammonia, the evaporation of ammonia is accelerated, an excessive amount of the supply body of ammonium ions needs to be added so as to maintain a predetermined ammonia concentration, thereby causing high costs.

(Inorganic Alkaline Aqueous Solution in Crystal Core Generation Process and Core Growing Process)

With respect to the inorganic alkaline solution for use in adjusting the pH value, not particularly limited, for example, alkali metal hydroxide aqueous solutions, such as sodium hydroxide, potassium hydroxide, or the like, may be used. In the case of using such an alkali metal hydroxide, the supply thereof may be directly carried out, or from the viewpoint of easiness for the pH control at the time of crystallization, an aqueous solution thereof is preferably added thereto.

Moreover, with respect to the method for adding the inorganic alkaline aqueous solution, not particularly limited, a pump capable of controlling a flow rate, such as a quantitative pump, may be used for the addition while sufficiently stirring the reaction aqueous solution and the plate-shaped crystal core slurry so as to maintain the pH value within a predetermined range.

(Production Facility)

In the production method for a nickel composite hydroxide, a device of a system that does not recover the product until the reaction has been completed is used. For example, a normally-used batch reaction vessel with a stirrer being installed therein is included therein. In the case when such a device as not to recover the product until the reaction has been completed is adopted, different from a continuous crystallization device in which the product is recovered simultaneously with a general overflow liquid, since such a problem as to recover growing particles simultaneously with the over flow liquid does not occur, it becomes possible to obtain particles having uniform particle sizes with a narrowed grain size distribution.

Moreover, in an attempt to control the reaction atmosphere, it is preferable to use a device capable of controlling the atmosphere, such as a tightly-closed device or the like. By using the device of this type, it becomes possible to easily allow the resulting nickel composite hydroxide to have a shape in which spherical or lump-shaped nickel composite hydroxide particles are coupled to one after another in two dimensional directions.

[2] Nonaqueous Electrolytic Secondary Cell-Use Positive Electrode Active Material and Method for Producing Such a Material (2-1) Nonaqueous Electrolytic Secondary Cell-Use Positive Electrode Active Material A lithium nickel composite oxide in accordance with the present embodiment is obtained by using the aforementioned nickel composite hydroxide as its precursor. The lithium nickel composite oxide is represented by a general formula (2): $Li_{1+u}Ni_{1-x-y-z}Co_xMn_yM_zO_2$ (where, $-0.05 \leq u \leq 0.50$, $0 \leq x \leq 0.35$, $0 \leq y \leq 0.35$, $0 \leq z \leq 0.1$, $0 < x+y$, $0 < x+y+z \leq 0.7$, with M being at least one kind of additive element selected from the group consisting of V, Mg, Al, Ti, Mo, Nb, Zr and W), and is composed of a lithium nickel composite oxide having a layer structure of a cubic crystal system. This lithium nickel composite oxide is composed of secondary particles in which spherical or lump-shaped lithium nickel composite oxide particles, which are formed by primary particles aggregated with one after another, are coupled with one after another in two dimensional directions. These secondary particles have the volume average particle size (Mv) of 4 to 20 mm measured by a laser diffraction/scattering method and a ratio (Mv/L) of the volume average particle size relative to the width (L) of the secondary particles in a direction perpendicular to the coupling direction thereof in a range from 4 to 20.

(Composition)

In the positive electrode active material, u, which represents an excessive amount of lithium, is set in a range from −0.05 to 0.50. In the case when the amount of excessive lithium u is less than −0.05, that is, when the content of lithium is smaller than 0.95, since the reaction resistance of the positive electrode in a nonaqueous electrolytic secondary cell using the resulting positive electrode active material becomes greater, the output of the cell is lowered.

In contrast, in the case when the amount of excessive lithium u exceeds is 0.50, that is, when the content of lithium is greater than 1.50, the initial discharging capacity is lowered in the case of using the positive electrode active material as the positive electrode of the cell, and the reaction resistance of the positive electrode also becomes greater. In order to further reduce the reaction resistance, the amount of excessive lithium u is preferably set to 0.10 or more, more preferably, to 0.35 or less.

In this case, x, which represents the content of cobalt, is set in a range of $0 \leq x \leq 0.35$. The cobalt is an additive element that devotes to improvement of the cycle characteristics. When the value of x exceeds 0.35, the reduction of the initial discharging capacity becomes greater.

On the other hand, y, which represents the content of manganese, is set in a range of $0 \leq y \leq 0.35$. The manganese is an additive element that devotes to improvement of thermal stability. In the case when the value of y exceeds 0.35, since manganese elutes into the electrolytic solution upon storage at high temperatures and during an operation, the characteristics tends to deteriorate.

In this case, x+y, which indicates the total amount of cobalt and manganese, satisfies $0 < x+y$. As described above, since the nickel composite hydroxide forming a precursor for use in producing the positive electrode active material is formed by developing a plate-shaped crystal core composed of at least either a hydroxide of cobalt or that of manganese, $0 < x+y$ is satisfied, and $0.05 \leq x+y$ is preferably satisfied, and $0.1 \leq x+y$ is then more preferably satisfied.

As indicated by general formula (2), the positive electrode active material is preferably adjusted so as to allow the lithium nickel composite oxide particles to contain an additive element. By allowing it to contain an additive element, a cell formed by using the resulting positive electrode active material makes it possible to improve its durability and output characteristics. In particular, by uniformly distributing the additive element over the surface or inside of each particle, these effects are obtained by the entire particles so that the addition of a small amount thereof makes it possible to provide these effects and consequently to suppress a reduction of the capacity.

In the case when the mole ratio z of the added element M to all the atoms exceeds 0.1, since metal elements devoting to a Redox reaction are reduced, this state is not preferable because of a reduction of the cell capacity. Therefore, the mole ratio of the added element M is adjusted so as to be located in a range of $0 \leq z \leq 0.1$.

(Particle Shape·Structure)

The positive electrode active material uses as its precursor a nickel composite hydroxide composed of secondary particles in which spherical or lump-shaped lithium nickel composite oxide particles, which are formed by a plurality of primary particles aggregated with one after another, are coupled with one after another in two dimensional directions. Therefore, in the same manner as in the nickel composite hydroxide, the positive electrode active material is composed of secondary particles in which spherical or lump-shaped lithium nickel composite hydroxide particles, which are formed by aggregated primary particles, are coupled to one after another in two-dimensional directions.

Since the positive electrode active material having this shape has a concavity in a coupling portion among the spherical or lump-shaped lithium nickel composite oxide particles, the specific surface area is widened in comparison with that of the plate-shaped particles. Moreover, since the individual spherical or lump-shaped particles have a small particle size, inserting and drawing processes of lithium are easily carried out so that the inserting and drawing speeds become higher. Moreover, since the secondary particles are formed by constitutive particles in which primary particles are aggregated, and the lithium inserting and drawing processes are carried out in the gap or the grain boundary among the primary particles, it becomes possible to further increase the inserting and drawing speeds. These effects make the output characteristics similar to that of particles having a small particle size, thereby greatly improving the output characteristics in comparison with that of the plate-shaped particles.

On the other hand, since the individual secondary particles have their constitutive particles coupled to one another in two-dimensional directions, by filling these in an oriented state upon forming an electrode, the gaps among particles can be reduced as in the case of filling small particle-size particles, thereby making it possible to provide a high filling density and a high volume-energy density. Moreover, the electrode can be formed into a thin film. Therefore, by using the positive electrode active material composed of secondary particles having a shape in which spherical or lump-shaped nickel composite hydroxide particles, which are formed by aggregated primary particles, are coupled to one after another in two-dimensional directions, as described above, it becomes possible to achieve both of high output characteristics with high cell capacity and high electrode density.

The positive electrode active material has the volume average particle size (Mv) of 4 to 20 µm measured by a laser diffraction/scattering method and a ratio (Mv/L, hereinafter, sometimes referred to also as "aspect ratio") of the volume average particle size relative to the width (L) of the secondary particles in a direction perpendicular to the coupling direction thereof in a range from 3 to 20.

In the case when Mv is less than 4 mm, even if the spherical or lump-shaped lithium nickel composite oxide particles have a coupled shape in the two dimensional directions, the volume-energy density is lowered since gaps among the secondary particles increase at the time of a filling process. Moreover, since the viscosity increases upon kneading an electrode-forming slurry, the handling characteristics is lowered. When Mv exceeds 20 µm, streaks are caused at the time of forming an electrode film and short-circuits are caused due to penetration through a separator. By setting the volume average particle size (Mv) in a range from 4 to 20 µm, it becomes possible to obtain a positive electrode active material that has a high voltage-energy density at the electrode and is free from streaks at the time of forming an electrode film and short-circuits caused due to penetration through a separator.

In the case when the aspect ratio is less than 3, since the particle size of secondary particles becomes large, the specific surface area is reduced to cause an insufficient contact to the electrolytic solution. Moreover, resistance becomes greater in an attempt to disperse lithium to the inside of each particle. For this reason, the effects obtained by the coupled shape in the two dimensional directions are not exerted sufficiently resulting in degradation of the output characteristics. In contrast, in the case when the aspect ratio exceeds 20, the particle strength of the secondary particles is lowered, with the result that the particles easily collapse at the time of kneading the electrode-forming slurry, failing to obtain the effects exerted by the coupled shape in the two dimensional directions. Moreover, the filling density to the electrode is also lowered to cause a reduction in the volume-energy density. The width (L) of the secondary particles can be found by using the same method as that of the nickel composite hydroxide particles.

Moreover, the positive electrode active material is preferably designed to have the width (L) of secondary particles in a range of 1 to 5 µm. In the case when the width (L) of secondary particles is less than 1 µm, the strength of the positive electrode active material is lowered, with the result that the particles tend to easily collapse upon kneading the electrode-forming slurry. Moreover, in the case when the width (L) of secondary particles exceeds 5 µm, the specific surface area is reduced, with the result that the output characteristics tends to sometimes deteriorate.

The secondary particles in which primary particles are coupled to one another in the two-dimensional directions may have coupled particles in the two-dimensional directions superposed as layers, as long as the aspect ratio (Mv/L) and the width (L) are respectively located in the aforementioned ranges, and the superposed portion may be a partial portion or the entire portion. The diameter (length in a direction perpendicular to the two-dimensional directions) of the constitutive particles is the same as the width (L) of the secondary particles as a single layer, and in the case when superposed into layers, the diameter becomes smaller than the width (L) of the secondary particles. Therefore, the diameter of the constitutive particles is preferably set to 1 to 5 µm.

Moreover, the secondary particles are not necessarily formed into a complete plane shape, and a center portion of the constitutive particles may deviate from the plane. As long as the secondary particles as a whole are formed by constitutive particles coupled to one another so as to expand in the two dimensional directions, it is possible to achieve both of high output characteristics with high cell capacity and high electrode density.

The width (L) of the secondary particles can be measured in the same manner as in the nickel composite hydroxide. Moreover, the diameter of the constitutive particles can be found by measuring the constitutive particles in association with the width (L) of the secondary particles.

(Specific Surface Area)

The positive electrode active material is preferably designed to have a specific surface area in a range from 0.3 to 2 m$^2$/g. In the case when the specific surface area is less than 0.3 m$^2$/g, the contact to the electrolytic solution is not sufficiently obtained, with the result that the output characteristics and the cell capacity are sometimes lowered. In contrast, in the case when the specific surface area exceeds 2 m$^2$/g, the decomposition of the electrolytic solution is accelerated to sometimes cause degradation of stability and degradation of high-temperature storing property due to elution of manganese when manganese is added. By setting the specific surface area in a range of 0.3 to 2 m$^2$/g, it becomes possible to obtain superior cell characteristics and also to ensure stability and high-temperature storing property.

(Grain Size Distribution)

The positive electrode active material is designed to have a deviation index [(D90–D10)/Mv] of particle size of 0.75 or less, which is calculated by using D90 and D10 in grain size distribution obtained by the laser diffraction/scattering method and the volume average particle size (Mv).

When the grain size distribution of the positive electrode active material is located within a wide range, fine particles having very small grain sizes relative to the average grain size and bulky particles having very large grain sizes relative to the average grain size are mixed into the positive electrode active material. In the case when the positive electrode is formed by using a positive electrode active material containing many fine particles, heat might be generated due to local reactions of the fine particles, with the result that the stability is lowered and the cycle characteristics deteriorates because of selective deterioration of the fine particles. In the case when the positive electrode is formed by using a positive electrode active material containing many bulky particles, it is not possible to provide a sufficient reaction area between the electrolytic solution and the positive electrode active material, resulting in a reduction of the cell output due to an increase of reaction resistance. In the case when the deviation index is small, although the characteristics of the positive electrode active material can be improved, it is difficult to completely suppress deviations in the grain sizes so that the actual lower limit of the deviation index in the present invention is set to about 0.30.

Therefore, by setting the grain size distribution of the positive electrode active material to 0.75 or less in the deviation index [(D90–D10)/Mv] of particle size, the ratio of fine particles and bulky particles can be reduced. A cell that uses such a positive electrode active material for its positive electrode is superior in stability and exerts good cycle characteristics and cell output. Additionally, the average particle size, D90 and D10 are the same as those of the aforementioned composite hydroxide particles, and can be obtained by using the same measuring methods.

Moreover, the positive electrode active material is preferably designed to have a site occupation rate of 7% or less of metal ions other than those of lithium of 3a site and also have a site occupation rate of 7% or less of lithium ions of 3b site, obtained by Rietveld analysis of X-ray diffraction analysis. When the site occupation rates of 3a site and 3b site exceed these ranges, the lithium nickel composite oxide is brought into a cation mixing state, indicating that crystallinity is low. In the case when crystallinity is low, influences of interference of lithium ion transport by metal ions of 3a site and lithium ion inactivation at 3b site are strongly exerted to sometimes cause degradation of cell characteristics, in particular, in charging/discharging capacities and output characteristics.

Moreover, the positive electrode active material is preferably designed to have an orientation index of 0.9 to 1.1 on (003) plane by the X-ray diffraction analysis. This orientation index indicates that crystals are placed side by side at random without orientation. By placing crystals side by side at random without orientation, it is possible to achieve both of the cell capacity as well as the output characteristics that are influenced by the inserting and drawing characteristics of lithium and the cycle characteristics as well as stability that are influenced by the durability of a layered structure. In the case when the orientation index of (003) plane deviates toward either of the sides, it becomes impossible to achieve both of the required characteristics for a cell at a high level, sometimes making any of the cell characteristics insufficient.

The above-mentioned positive electrode active material is represented by general formula (2): Li$_{1+u}$Ni$_{1-x-y}$Co$_x$M$_y$O$_2$ (where, $-0.05 \leq u \leq 0.50$, $0 \leq x \leq 0.35$, and $0 \leq y \leq 0.35$, with M being at least one kind of additive element selected from the group consisting of Mn, V, Mg, Al, Ti, Mo, Nb, Zr and W), and is composed of a composite oxide containing lithium of a cubic crystal system having a layer structure. By using this composition, the resulting material is allowed to exert superior performances as a positive electrode active material for use in a nonaqueous electrolytic secondary cell.

Moreover, since the lithium nickel composite oxide is composed of secondary particles in which spherical or lump-shaped lithium nickel composite oxide particles, which are formed by primary particles aggregated with one after another, are coupled with one after another in two dimensional directions, it is possible to obtain an increased contact area to the electrolytic solution and a high filling density derived from the plate shape. For these reasons, in the case when the lithium nickel composite oxide is used as the positive electrode active material, it is possible to obtain high output characteristics and cell capacity as well as a high electrode density.

(2-2) Production Method of Nonaqueous Electrolytic Secondary Cell-Use Positive Electrode Active Material This production method for a lithium nickel composite oxide is provided with at least a mixing process in which a lithium compound is mixed with particles of the aforementioned nickel composite hydroxide or nickel composite oxide obtained by baking the nickel composite hydroxide in an oxidizing atmosphere, to form a mixture, and a baking process for baking the mixture formed in the mixing process.

The production method for a positive electrode active material is not particularly limited as long as a positive electrode active material is formed so as to have the aforementioned shape, structure and composition of secondary particles; however, the following method is preferably adopted since the positive electrode active material can be positively produced. The following description will discuss the respective processes.

(a) Thermal Treatment Process

First, the nickel composite hydroxide prepared described above is subjected to a thermal treatment, if necessary.

The thermal treatment process is a process in which the thermal treatment is carried out by heating the nickel composite hydroxide at a temperature of 300 to 750° C., and moisture contained in the composite hydroxide is thus removed. By carrying out this thermal treatment process, moisture remaining in the particles up to a baking process can be reduced to a predetermined amount. Consequently, the ratio of the number of atoms of metals and the number of atoms of lithium contained in the positive electrode active material to be produced can be prevented from deviating. Therefore, in the case when the ratio of the number of atoms of metals and the number of atoms of lithium contained in the positive electrode active material are correctly controlled, the present process can be omitted.

In the thermal treatment process, it is only required to remove moisture in such a degree as not to cause deviations in the ratio of the number of atoms of metals and the number of atoms of lithium contained in the positive electrode active material; therefore, it is not necessarily required to convert all the nickel composite hydroxide into a nickel composite oxide. However, in order to further reduce deviations in the number of atoms, by setting the heating temperature to 500° C., all the nickel composite hydroxide is preferably converted to the nickel composite oxide.

In the case when the heating temperature in the thermal treatment process is less than 300° C., it is not possible to remove excessive moisture in the nickel composite hydroxide, thereby failing to suppress the deviations. In contrast, in the case when the heating temperature exceeds 750° C., the particles are sintered by the thermal treatment, thereby failing to obtain a nickel composite oxide having a uniform particle size. By preliminarily finding metal components contained in the nickel composite hydroxide under thermal treatment conditions by an analyzing process so as to determine a ratio to the lithium compound, the deviations in the numbers of atoms can be suppressed.

The atmosphere of the thermal treatment process is not particularly limited as long as it is a non-reducing atmosphere; however, the thermal treatment is preferably carried out in an air flow that can be carried out easily.

Moreover, although not particularly limited, the thermal treatment time is preferably set to at least 1 hour or more, and more preferably, in a range from 5 to 15 hours, because the thermal treatment time of less than 1 hour tends to fail to sufficiently remove excessive moisture from the nickel composite hydroxide particles.

Furthermore, the facility for use in the thermal treatment is not particularly limited as long as it can heat the nickel composite hydroxide particles in a non-reducing atmosphere, more preferably, in an air flow, and for example, an electric furnace or the like without causing a gas generation is preferably use.

(b) Mixing Process

In a mixing process, the nickel composite hydroxide subjected to the thermal treatment in the thermal treatment process (hereinafter, referred to also as "thermally treated particles") or the nickel composite hydroxide that has not been subjected to the thermal treatment when the thermal treatment process has been omitted and a substance containing lithium, for example, a lithium compound, are mixed so that a lithium mixed material is obtained.

In this case, the thermally treated particles include not only the composite hydroxide from which the remaining moisture has been removed in the thermal treatment process, but also the composite oxide converted into an oxide in the thermal treatment process, or mixed particles of these.

The thermally treated particles or the nickel composite hydroxide that has not been subjected to the thermal treatment and the lithium compound are mixed with each other so that a ratio (Li/Me) of the sum of the number of atoms (Me) of metals other than lithium in the lithium mixed material, that is, nickel, manganese, cobalt and an additive element, to the number of atoms (Li) of lithium is set in a range from 0.95 to 1.5, preferably, from 1 to 1.5, and more preferably, from 1 to 1.35. That is, since there is no change in Li/Me before and after the baking process, the ratio Li/Me of this mixing process corresponds to Li/Me in the positive electrode active material so that the mixing process is carried out so as to make Li/Me in the lithium mixed material the same as Li/Me in a positive electrode active material to be obtained.

Although not particularly limited, the lithium compound for use in forming the lithium mixed material is preferably prepared as, for example, lithium hydroxide, lithium nitrate, lithium carbonate, and a mixture of these, from the viewpoint of easiness in obtaining. In particular, when easiness in handling and stability of quality are taken into consideration, lithium hydroxide or lithium carbonate is more preferably used.

Additionally, the lithium mixed material is preferably mixed sufficiently prior to the baking process. When the mixing process is insufficient, Li/Me deviates among individual particles, with the result that problems, such as a failure to provide a sufficient cell characteristics, or the like, might occur.

Moreover, in the mixing process, a general-use mixing device can be used, and examples thereof include a shaker mixer, a Loedige mixer, a Julia mixer, a V-blender, etc. The mixing process may be carried out in such a degree as not to break the shape of the thermally treated particles or the like, with the thermally treated particles as well as the nickel composite hydroxide and the lithium compound being sufficiently mixed with one another.

(c) Baking Process

The baking process is a process in which the lithium mixed material obtained in the mixing process is baked so that a lithium nickel composite oxide is formed. In the case when the lithium mixed material is baked in the baking process, since lithium in the lithium compound is diffused in the thermally treated particles and nickel composite hydroxide particles, lithium nickel manganese composite oxide particles are formed. Moreover, even in the case when a high concentration layer of cobalt and/or manganese exists in the nickel composite hydroxide, the high concentration layer disappears by the diffusion so that a structural layer-state matter no longer exists.

(Baking Temperature)

The baking process of the lithium mixed material is carried out at 650 to 980° C., more preferably, at 750 to 950° C. In the case when the baking temperature is less than 650° C., the lithium diffusion into the thermally treated particles and the nickel composite hydroxide is not carried out sufficiently to cause excessive lithium and unreacted particles to remain or to cause a failure to sufficiently match crystal structures, failing to provide a sufficient cell characteristics when used as a cell. Moreover, in the case when the baking temperature exceeds 980° C., sintering occurs strongly among the nickel composite oxide particles, and an abnormal grain growth might occur; for this reason, the resulting particles after the baking process become bulky, with the result that it might become incapable of maintaining the aforementioned particle shape of the secondary particles.

This positive electrode active material fails to provide effects derived from the aforementioned shape of the secondary particles.

Additionally, from the viewpoint of carrying out the reaction uniformly among the thermally treated particles, the nickel composite hydroxide and the lithium compound, it is preferably to raise the temperature up to the baking temperature with the raising speed being set to 3 to 10° C./min. Moreover, by keeping the temperature at about the melting point of the lithium compound for about 1 to 5 hours, the reaction can be more uniformly carried out.

(Baking Time)

The holding time at the predetermined temperature of the baking time is preferably set to at least 2 hours or more, and more preferably, to 4 to 24 hours. The holding time of less than 2 hours sometimes fails to sufficiently generate a lithium nickel composite oxide. In the case when after the holding time, the lithium mixed material is mounted on a saggar and subjected to a baking process, although not particularly limited, in order to suppress degradation of the saggar, it is preferable to cool the atmosphere down to 200° C. or less, with a temperature lowering speed being set to 2 to 10° C./min.

(Temporary Baking Process)

In particular, in the case when lithium hydroxide or lithium carbonate is used as the lithium compound, it is preferably held and subjected to a temporarily baking process prior to a baking process at a temperature lower than the baking temperature, that is, at a temperature from 350 to 800° C., preferably from 450 to 780° C., for about 1 to 10 hours, preferably, for about 3 to 6 hours. In other words, it is preferably subjected to the temporarily baking process at a reaction temperature among lithium hydroxide, lithium carbonate, thermally treated particles and nickel composite hydroxide. In this case, when held in the vicinity of the reaction temperature of lithium hydroxide and lithium carbonate, the lithium diffusion into the thermally treated particles and the nickel composite hydroxide is sufficiently carried out so that a uniform lithium nickel composite oxide can be obtained.

(Baking Atmosphere)

The atmosphere at the time of the baking process is an oxidative atmosphere, with its oxygen concentration being preferably set to 18 to 100 volume %, and is, in particular, preferably prepared as a mixed gas atmosphere among oxygen and an inert gas. That is, the baking process is preferably carried out in the atmosphere or in an oxygen gas flow. In the case when the oxygen concentration is less than 18 volume %, the lithium nickel composite oxide might be brought into a state in which its crystallinity is insufficient.

Additionally, although not particularly limited, as long as it can heat the lithium mixed material in the atmosphere or in an oxygen gas flow, the furnace for use in the baking process is preferably an electric furnace without generating any gas, from the viewpoint of uniformly maintaining the atmosphere inside the furnace, and either a batch-type or continuous-type furnace may be used.

(Disintegration)

The lithium nickel manganese composite oxide particles obtained by the baking process sometimes have aggregations or slight sintering occurred therein. In this case, a disintegrating process may be carried out thereon so that a lithium nickel composite oxide, that is, a positive electrode active material in accordance with the present embodiment, can be obtained.

Additionally, the disintegration refers to an operation in which by applying a mechanical energy to an aggregate body composed of a plurality of secondary particles caused by sintered necking or the like among secondary particles at the time of baking, the secondary particles are separated from each other without causing hardly any breakage in the secondary particles themselves, thereby loosening the aggregate body.

[3] Nonaqueous Electrolytic Secondary Cell

A nonaqueous electrolytic secondary cell is formed by adopting a positive electrode using the aforementioned positive electrode active material. First, the following description will discuss a structure of the nonaqueous electrolytic secondary cell.

A nonaqueous electrolytic secondary cell (hereinafter, referred to simply as "secondary cell") in accordance with the present embodiment is provided with virtually the same structure as that of a general-use nonaqueous electrolytic secondary cell except that the aforementioned positive electrode active material is used as its positive electrode material; therefore, only a simplified explanation will be given.

Specifically, the secondary cell has a structure provided with a case, and a positive electrode, a negative electrode, a nonaqueous electrolytic solution and a separator housed inside the case. More specifically, an electrode body is formed by stacking the positive electrode and the negative electrode with the separator interposed therebetween, and the resulting electrode body is impregnated with the nonaqueous electrolytic solution, with a positive electrode collector of the positive electrode and a positive electrode terminal externally connected, as well as a negative electrode collector of the negative electrode and a negative electrode terminal externally connected, are connected to each other by using a collector lead or the like, and these are tightly closed into a case so that a secondary cell is formed.

Additionally, it is needless to say that the structure of a secondary cell to which the present invention is applicable is not intended to be limited by the above-mentioned example, and various shapes, such as a cylinder shape, a laminated shape or the like, may be used for its outer shape.

(Positive Electrode)

A positive electrode is a sheet-like member, and can be formed by applying a positive electrode combined material paste containing the positive electrode active material in accordance with the embodiment of the present invention onto a surface of a collector made of, for example, aluminum so as to be dried thereon.

Additionally, the positive electrode is processed on demand in accordance with a cell to be used. For example, a cutting process for forming into an appropriate size in accordance with a target cell and a pressure compressing process by using a roller press for increasing an electrode density, or the like, are carried out.

The positive electrode combined material paste is formed by adding a solvent to a positive electrode combined material and kneading these. The positive electrode combined material is formed by mixing the positive electrode active material of the present invention formed into powder, a conductive material and a binder together.

The conductive material is a material that is added so as to provide an appropriate conductivity to the electrode. Although not particularly limited, the conductive material may be formed by using, for example, graphite (natural graphite, artificial graphite, expanded graphite, etc.), and a carbon black-based material, such as acetylene black and Ketchen Black.

The binder is a material having a function for binding the positive electrode active material particles to one another. Although not particularly limited, the binder for use in the positive electrode binding material is formed by using, for example, polyvinylidene fluoride (PVDF), polytetrafluoroethylene (PTFE), fluorine rubber, ethylene propylene diene rubber, styrene butadiene, cellulose-based resins, polyacrylic acid, etc.

Additionally, activated carbon or the like may be added to the positive electrode binding material, and by adding activated carbon or the like thereto, the electrical double layer capacity in the positive electrode can be increased.

The solvent is used for dissolving the binder so that the positive electrode active material, conductive material, activated carbon and the like are diffused in the binder. Although not particularly limited, the solvent may be prepared as, for example, an organic solvent, such as N-methyl-2-pyrolidone.

Moreover, a mixing ratio of the respective substances in the positive electrode combined material is not particularly limited. For example, supposing that solid components of the positive electrode combined material except for the solvent represent 100 parts by mass, the material for the positive electrode is set to the same as that of a general-use nonaqueous electrolytic secondary battery, and the content of the positive electrode active material may be set to 60 to 95 parts by mass, the content of the conductive material may be set to 1 to 20 parts by mass, and the content of the binder may be set to 1 to 20 parts by mass.

(Negative Electrode)

A negative electrode is a sheet-like member, which is formed by applying a negative electrode combined material paste onto a surface of a metal foil collector made of copper or the like so as to be dried thereon. The negative electrode is formed by using virtually the same method as that of the positive electrode, although its component forming the negative electrode combined paste and its compounding ratio as well as the material for the collector are different therefrom, and various processes are carried out thereon in the same manner as in the positive electrode, if necessary.

The negative electrode combined material paste is formed by adding an appropriate solvent to a negative electrode combined material formed by mixing the negative electrode active material and a bonder with each other so as to be formed into a paste.

The negative electrode active material may be prepared as, for example, a substance containing lithium, such as metal lithium and lithium alloy, and an occlusion substance to and from which lithium ions are occluded and separated.

Although not particularly limited, the occlusion substance may be prepared as, for example, an organic compound sintered material, such as natural graphite, artificial graphite, phenolic resin, or the like, or a powder material of carbon substance such as cokes. In the case when this occlusion substance is adopted as the negative electrode active material, a fluorine-containing resin, such as PVDF, may be used as the binder in the same manner as in the positive electrode, and as the solvent for use in diffusing the negative electrode active material into the binder, an organic solvent, such as N-methyl-2-pyrolidone, may be used.

(Separator)

A separator is disposed in a manner so as to be sandwiched between the positive electrode and the negative electrode, and has a function for separating the positive electrode and the negative electrode from each other and for holding an electrolyte. The separator is formed as a thin film made of, for example, polyethylene, polypropylene or the like, which has a large number of fine pores formed therein. Additionally, as long as it has a separator function, the film is not particularly limited.

(Nonaqueous Electrolytic Solution)

A nonaqueous electrolytic solution is formed by dissolving a lithium salt serving as a support salt into an organic solvent. As the organic solvent, one kind of materials selected from the group consisting of cyclic carbonates, such as ethylene carbonate, propylene carbonate, butylene carbonate, trifluoropropylene carbonate, or the like; chain-shaped carbonates, such as diethyl carbonate, dimethyl carbonate, ethylmethyl carbonate, dipropyl carbonate, or the like; ether compounds, such as tetrahydrofuran, 2-methyl tetrahydrofuran, dimethoxyethane, or the like; sulfur compounds, such as ethylmethyl sulfone, butane sulfone, or the like; and phosphorus compounds, such as triethyl phosphate, trioctyl phosphate, or the like, may be used alone, or two or more kinds of these may be used in a mixed manner.

As the support salt, $LiPF_6$, $LiBF_4$, $LiClO_4$, $LiAsF_6$ and $LiN(CF_3SO_2)_2$, as well as composite salts of these, may be used.

Additionally, the nonaqueous electrolytic solution may contain a radical capturing agent, a surfactant, a flame retardant, or the like, so as to improve cell characteristics.

(Cell Characteristics of Nonaqueous Electrolytic Secondary Cell)

Since the secondary cell having the above-mentioned configuration is provided with the positive electrode using the positive electrode active material to which the present invention is applied, the contact area between the positive electrode active material and the nonaqueous electrolytic solution is increased and the filling density of the positive electrode active material is raised; therefore, high output characteristics and cell capacity can be obtained and a high electrode density can also be obtained. Thus, the secondary cell makes it possible to provide a high initial discharging capacity and a low positive electrode resistance, and has a high capacity with a high output. Moreover, the secondary cell has a high volume energy density. Furthermore, in comparison with a conventional positive electrode active material of lithium nickel-based oxide, the secondary cell has high thermal stability, and is superior in stability.

(Applications of Secondary Cell)

Since the secondary cell has superior cell characteristics, it is desirably applied to a power supply for a small-size portable electronic apparatus (notebook-type personal computers, portable telephone terminals, or the like) in which a high capacity is always required.

Moreover, the secondary cell is also desirably applied to a cell for use as a motor driving power supply in which a high output is required. In general, the cell becomes difficult to maintain its stability as its size becomes larger, and an expensive protective circuit is indispensably required. However, since the secondary cell in accordance with the present embodiment ensures superior stability, the stability can be easily maintained, and by simplifying the expensive protective circuit, low costs can be achieved. Moreover, since the device can be miniaturized and have a high output, it is desirably used for a power supply for a transporting apparatus in which a mounting space is limited.

EXAMPLES

The following description will describe the present invention in detail by means of examples and comparative examples; however, the present invention is not intended to be limited by these examples.

In example 1 and comparative example 1, upon production of a composite hydroxide and a positive electrode active material as well as upon production of a secondary cell, respective samples of special grade reagent chemicals made by Wako Pure Chemical Industries, Ltd. were used unless otherwise indicated.

[Evaluation of Composite Hydroxide]

First, a composite hydroxide was prepared, and evaluations of the particle shape, the volume-average particle size and the aspect ratio were carried out thereon.

Example 1

(Crystal Core Generation Process)

In example 1, to a crystallization reaction container with a capacity of 5 L to which four baffle plates were attached, a cobalt sulfate heptahydride and 900 ml of pure water were loaded, and this was heated to 60° C. in a thermostat by using a heating jacket, while being stirred at a revolution of 1000 rpm by using an inclined paddle with 6 blades so that a core generating aqueous solution was obtained. By allowing a nitrogen gas to flow through the reaction container, a nitrogen atmosphere was prepared, and at this time, the inner space of the reaction container had an oxygen concentration of 1.0%.

Next, a 25% sodium hydroxide aqueous solution was supplied to the core generating aqueous solution at a ratio of 6.5 mL/min so that the pH was raised up to 11.0 at a standard liquid temperature of 25° C., and this was then stirred for one hour to generate plate-shaped crystal cores so that a plate-shaped crystal core slurry was formed.

(Particle Growing Process)

A composite solution containing nickel sulfate (Ni mole concentration: 1.0 mol/L), cobalt sulfate (Co mole concentration: 0.6 mol/L) and manganese sulfate (Mn mole concentration: 0.4 mol/L) was prepared as a mixed aqueous solution.

To the plate-shaped crystal core slurry was added a 25% ammonia water so as to have an ammonia concentration of 10 g/L inside the vessel. Moreover, by further adding sodium hydroxide to the plate-shaped crystal slurry, the pH was adjusted to 11.6 at a standard liquid temperature of 25° C., and to this was then added a mixed aqueous solution was added at a rate of 12.9 ml/min, while a 25% ammonia water serving as a complexing agent was being supplied thereto at a rate of 1.5 ml/min, with a 25% sodium hydroxide aqueous solution being intermittently added thereto so as to control the pH to become constant, so that a nickel composite hydroxide was obtained.

Figure 4:
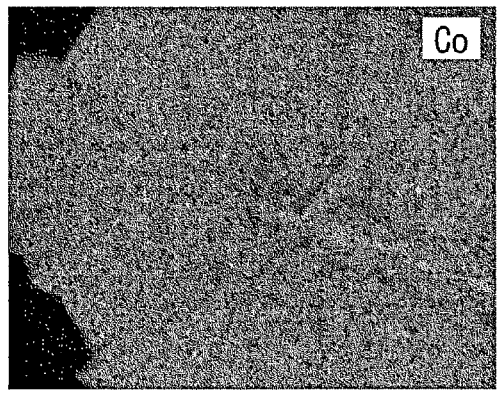
FIG. 4 is a photograph showing a cross section derived from an energy dispersion type X-ray analysis of a nickel composite hydroxide obtained in embodiment 1.
Figure 5:
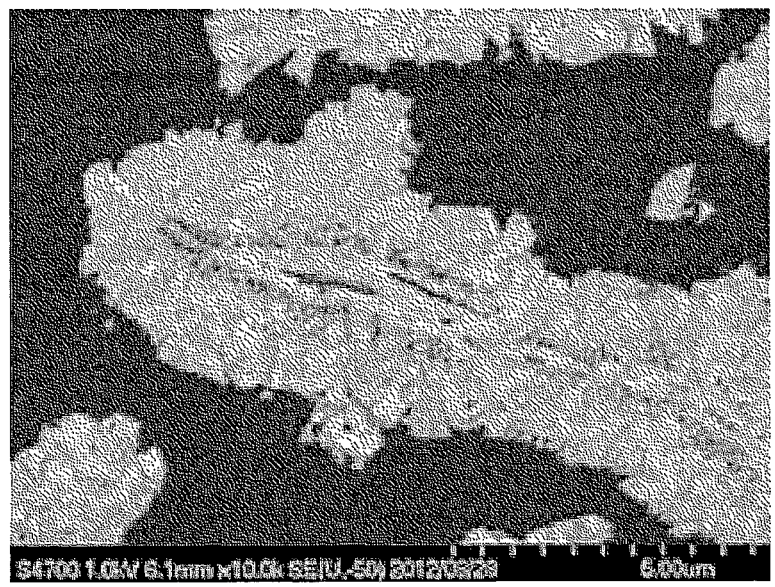
FIG. 5 is a photograph showing a cross section by a scanning electron microscope of a nickel composite hydroxide obtained in embodiment 1.
Figure 6:
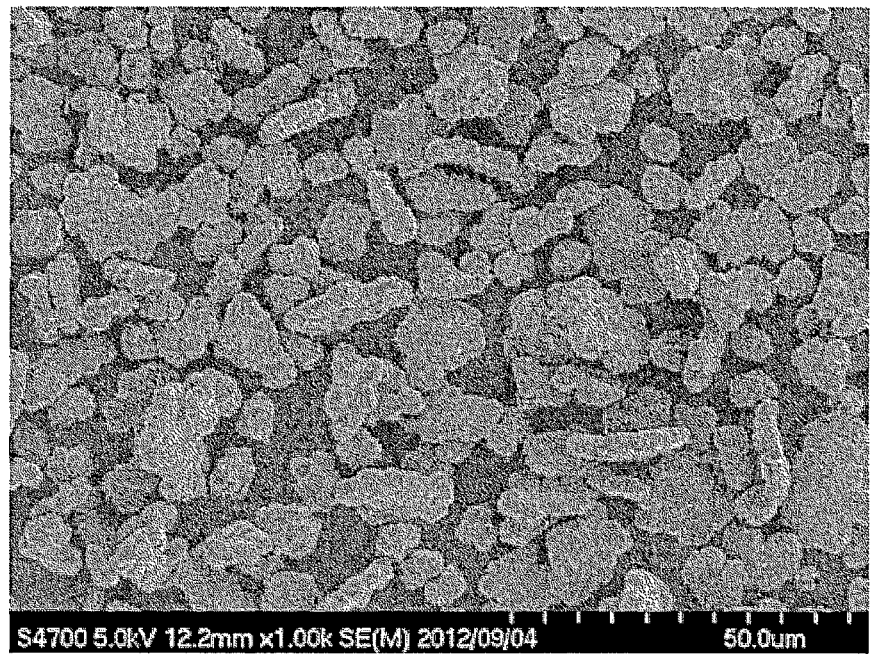
FIG. 6 is a photograph of a scanning electron microscope (observation magnification: 1000 times) of a nickel composite hydroxide obtained in embodiment 1.

FIG. 4 shows a cross section derived from an energy dispersion type X-ray analysis of a nickel composite hydroxide (secondary particles). As shown in FIG. 4, it is found that a high concentration layer containing cobalt was formed in the center portion in the width direction of a secondary particle. Moreover, FIG. 5 shows a result of observation of the secondary particle by using a scanning electron microscope (trade name S-4700, made by Hitachi High Technologies Co., Ltd.). As shown in FIG. 5, a plate shaped high concentration layer containing cobalt was located in the center portion in the width direction of the secondary particle, with particle growths derived from nickel, cobalt and manganese appearing on the two surfaces of the high concentration layer. FIG. 6 shows a scanning electron microscope photograph (observation magnification: 1000 times) of the nickel composite hydroxide. As shown in FIG. 6, the secondary particles were composed of spherical or lump shaped nickel composite hydroxide particles coupled to one after another in two dimensional directions.

The volume-average particle size (Mv) and the grain size distribution were evaluated based upon the measurement results by a laser diffraction type grain size distributor (trade name: Microtrac, made by Nikkiso Co., Ltd.). The width (L) of the secondary particle was measured by arbitrarily selecting 20 particles from an SEM image and calculating an average value. The analysis of the metal components was carried out by processes in which after dissolving the sample, observations were conducted by using ICP light emission spectrum method.

As a result, the volume-average particle size (Mv) of the secondary particle of the nickel composite hydroxide was 10.6 μm, and the aspect ratio was 4.9. Moreover, the composition was represented by $Ni_{0.50}Co_{0.20}M_{0.30}(OH)_2$.

Comparative Example 1

In comparative example 1, the same processes as those of example 1 were carried out except that the pH in the core generating process was raised to 11.3 at a standard liquid temperature of 25° C. so that a nickel composite hydroxide was obtained. As a result of evaluation carried out thereon in the same manner as in example 1, the volume average particle size (Mv) of the secondary particles of the resulting nickel composite hydroxide was 6.1 μm, and the aspect ratio was 2.1.

Figure 7:
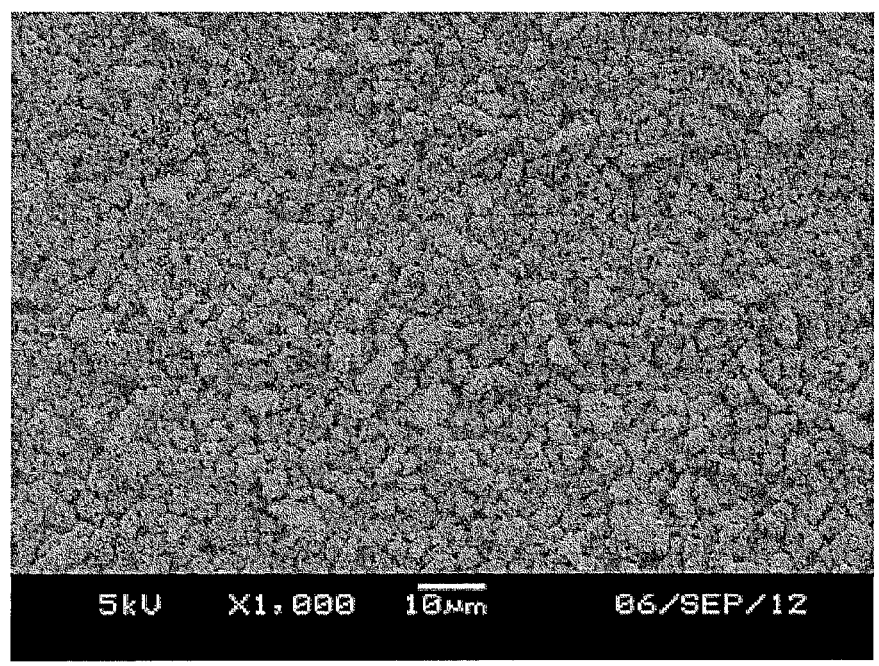
FIG. 7 is a photograph of the scanning electron microscope (observation magnification: 1000 times) of a nickel composite hydroxide obtained in comparative embodiment 1.

FIG. 7 shows the nickel composite hydroxide observed by a scanning electron microscope. As shown in FIG. 7, the secondary particles of the nickel composite hydroxide of comparative example 1 had a spherical or lump shape.

[Preparation of Positive Electrode Active Material]

Next, positive electrode active materials were prepared from the nickel composite hydroxides of example 1 and comparative example 1.

First, the nickel composite hydroxides respectively produced in example 1 and comparative example 1 were filtrated, and resulting particles were washed with water, and dried at 120° C. in the atmosphere for 24 hours. Lithium hydroxide was precisely weighed so as to set Li/Me=1.02 relative to the resulting dried powder, and mixed with each other so that a lithium mixed material was produced. Additionally, the mixing process was carried out by using a shaker mixer device (TURBULA Type T2C, made by Willie et Bakkofen (WAB) Co., Ltd.).

Figure 8:
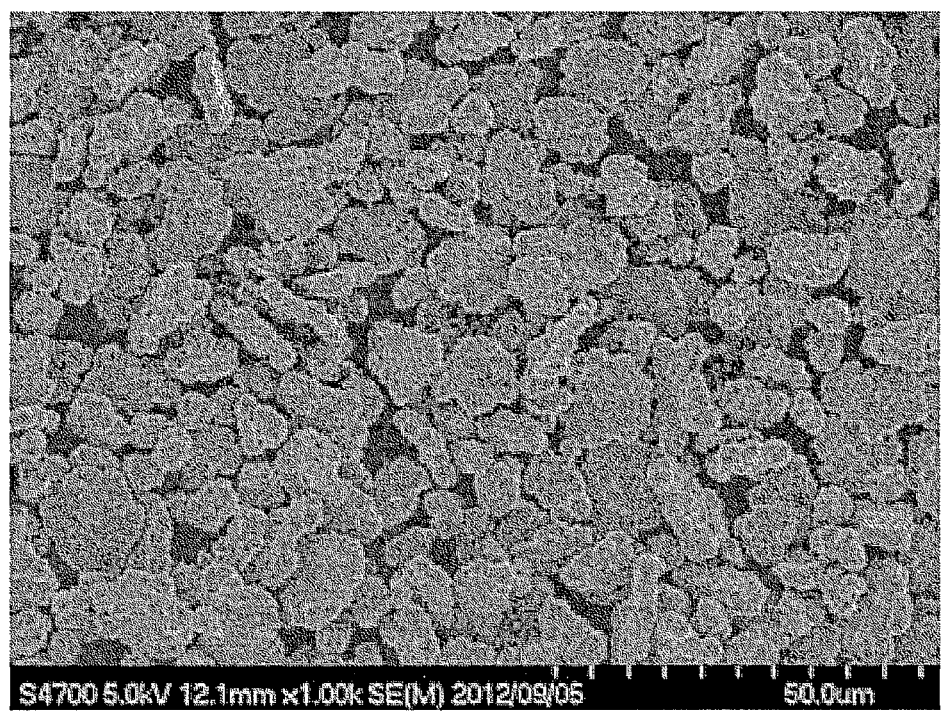
FIG. 8 is a photograph of a scanning electron microscope (observation magnification: 1000 times) of a positive electrode active material obtained in embodiment 1.

Next, the resulting lithium mixed material was baked at 900° C. in an air flow for 5 hours, and after having been cooled, the mixed material was cracked so that a positive electrode active material was obtained. The resulting positive electrode active material was confirmed to be a single phase of a lithium composite oxide of a cubic system by an X-ray diffraction method in both of example 1 and comparative example 1. FIG. 8 shows a photograph of the positive electrode active material produced by using the nickel composite hydroxide of example 1, which was taken by a scanning electron microscope. As shown in FIG. 8, in the same manner as in the nickel composite hydroxide, the positive electrode active material was composed of spherical or lump-shaped nickel composite oxide particles formed by aggregated plate-shaped primary particles, which were coupled to one after another in two-dimensional directions.

Table 1 collectively shows the volume-average particle size (Mv) of the resulting secondary particles of the lithium composite oxide, aspect ratio, composition ratio, non-lithium ion mixed rate into 3a site, lithium ion mixed rate into 3b site and (003) plane orientation index. From the results shown in Table 1, it is found that when the cobalt composite hydroxide of example 1 was used as the raw material, a coupled lithium composite oxide having a great aspect ratio could be obtained.

[Evaluation of Positive Electrode Active Material]

Next, a cell was produced in the following manner, and the evaluation of the resulting positive electrode active material was carried out by measuring the charging/discharging capacity.

Figure 9:
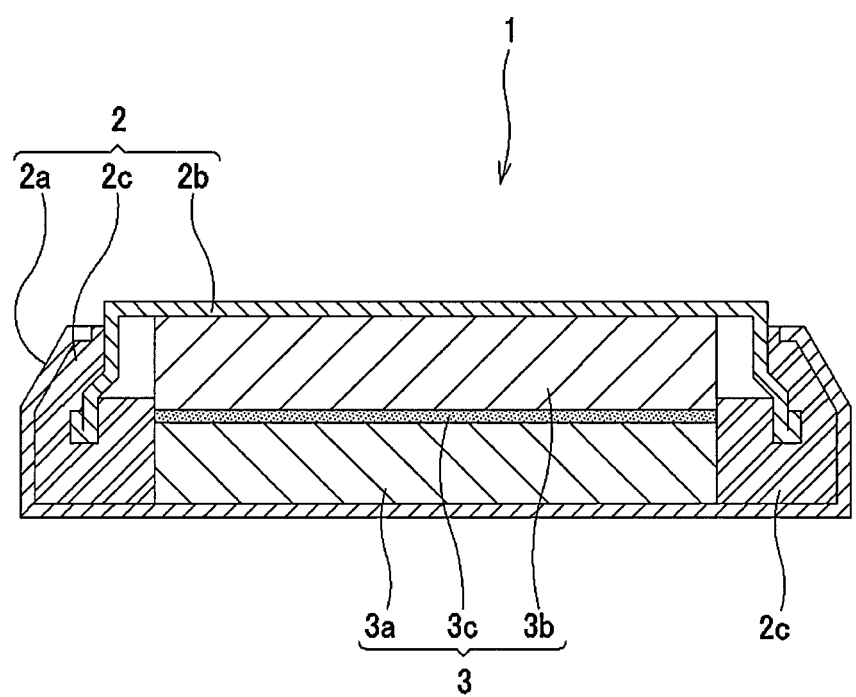
FIG. 9 is a schematic cross-sectional view of a coin-type cell.

In order to evaluate the charging/discharging characteristics, a 2032-type coin cell (hereinafter, referred to as coin-type cell 1) shown in FIG. 9 was used. As shown in FIG. 9, the coin-type cell 1 was constituted by a case 2, and an electrode 3 housed in this case 2.

The case 2 is provided with a positive electrode can 2a that is hollow with one end opened, and a negative electrode can 2b that is placed on the opening of the positive electrode can 2a, and these are configured such that when the negative electrode can 2b is placed on the opening of the positive electrode can 2a, a space to house the electrode 3 is formed between the negative electrode can 2b and the positive electrode can 2a.

The electrode 3 is formed by a positive electrode 3a, a separator 3c and a negative electrode 3b, which are stacked in parallel with one another in this order, and these are housed in the case 2 so that the positive electrode 3a is made in contact with the inner surface of the positive electrode can 2a, with the negative electrode 3b being made in contact with the inner surface of the negative electrode can 2b. Additionally, the case 2 is provided with a gasket 2c, and by this gasket 2c, the positive electrode can 2a and the negative electrode can 2b are secured from relative movements so as to keep the gap between the positive electrode can 2a and the negative electrode can 2b in a non-contact state. Moreover, the gasket 2c also has a function for tightly sealing the gap between the positive electrode can 2a and the negative electrode can 2b so as to shield the inside of the case 2 from the outside air-tightly as well as liquid-tightly.

The coin-type cell 1 was manufactured in the following manner.

First, the positive electrode active material (52.5 mg) of each of example 1 and comparative example 1, acetylene block (15 mg) and polytetrafluoroethylene (PTFE) (7.5 mg) were mixed with one another, and this was press-molded at a pressure of 100 MPa into a diameter 11 mm with a thickness of 100 μm so that the positive electrode 3a was manufactured. The positive electrode 3a thus manufactured was dried at 120° C. in a vacuum drier for 12 hours.

As the negative electrode 2, in order to evaluate the initial discharging capacity and the rate characteristics, lithium metal punched out into a disc shape with a diameter of 17 mm and a thickness of 1 mm was used, and in order to evaluate the cycle capacity maintaining rate, a negative electrode sheet formed by a copper foil on which graphite powder punched out into a disc shape having a diameter of 14 mm with an average particle size of about 20 μm and polyvinylidene fluoride were applied was used, respectively. As the separator 3, a polyethylene porous film with a film thickness of 25 μm was used. As the electrolytic solution, a mixed solution (made by Tomiyama Pure Chemical Industries Ltd.) containing the same amount of ethylene carbonate (EC) and diethyl carbonate (DEC), with 1M of LiClO$_4$ serving as a supporting electrolyte contained therein, was used.

By using these positive electrode 3a, negative electrode 3b, separator 3c and electrolytic solution, the above-mentioned coin-type cell 1 was manufactured inside a glove box in an Ar atmosphere with its dew point being managed to −80° C.

The performances of the manufactured coin-type cell 1 were evaluated by the initial discharging capacity, cycle capacity maintaining rate and rate characteristics.

The initial discharging capacity was measured by processes in which the coin-type cell 1 was left for about 24 hours since the production thereof, and after the open circuit voltage (OCV) had been stabilized, a charging process was carried out up to a cut-off voltage of 4.3 V, with a current density to the positive electrode being set to 0.1 mA/cm$^2$, and after a pause of one hour, a discharging process was then carried out at 0.05 C down to a cut-off voltage of 3.0 V; thus, the discharging capacity at this time was measured and defined as the initial discharging capacity.

The cycle capacity maintaining rate was measured by processes in which cycles including a charging process up to 4.2 V and a discharging process down to 3.0 V with a current density to the positive electrode being set to 2 mA/cm$^2$, were repeated 500 times, and the ratio of the discharging capacity after the repetitive charging and discharging processes and the initial discharging capacity was calculated and defined as the capacity maintaining rate. In the measurements of the charging and discharging capacities, a multichannel voltage/current generator (R6741A, made by Advantest Corporation) was used.

The rate characteristics was evaluated by the discharging capacity maintaining rate at the time of raising the discharging rate from 0.2 C to 5 C.

Table 2 shows the initial discharging rate, the capacity maintaining rate after a lapse of 200 cycles and the rate characteristics.

TABLE 1

|  | Volume-average particle size (μm) | Aspect ratio | Composition ratio | 3a site Non Li ion mixed rate (%) | 3b site Li ion mixed rate (%) | (003) plane orientation index |
| --- | --- | --- | --- | --- | --- | --- |
| Example 1 | 9.8 | 4.7 | Li$_{1.02}$Ni$_{0.50}$Co$_{0.20}$Mn$_{0.30}$O$_2$ | 4.0 | 5.0 | 1.08 |
| Comparative Example 1 | 5.8 | 1.9 | Li$_{1.02}$Ni$_{0.50}$C$_{0.20}$Mn$_{0.30}$O$_2$ | 4.8 | 5.2 | 1.03 |

TABLE 2

|  | Initial discharging capacity (mAh/g) | Discharging capacity at 5 C/Discharging capacity at 0.2 C (%) | Capacity maintaining rate after 200 cycles (%) |
| --- | --- | --- | --- |
| Example 1 | 169 | 72.3 | 92 |
| Comparative Example 1 | 165 | 60.2 | 89 |

From the results shown in Table 1, in example 1 in which the pH value in the crystal core generating aqueous solution of the crystal core generation process is set in a range from 7.5 to 11.1, with the pH in slurry for the particle growth of the particle growing process being set in a range from 10.5 to 12.5, as shown in FIG. 6, secondary particles in which spherical or lump-shaped nickel composite hydroxide, which are formed by primary particles grown as particles, are coupled with one after another in two dimensional directions, are obtained. The positive electrode active material that uses such nickel composite hydroxide has a high aspect ratio. Moreover, the resulting positive electrode active material has a high charging capacity maintaining rate with a superior rate characteristics.

In contrast, in comparative example 1 in which the pH in the crystal core generating aqueous solution of the crystal core generation process is set to 11.3, as shown in FIG. 7, different from example 1, those secondary particles in which spherical or lump-shaped nickel composite hydroxide particles, which are formed by primary particles grown as particles, are coupled with one after another in two dimensional directions, are not obtained. In such comparative example 1, the aspect ratio of the positive electrode active material is small, and the capacity maintaining rate and the rate characteristics are inferior to those of example 1.

REFERENCE SIGNS LIST

1 . . . coin type cell, 2 . . . case, 2a . . . positive electrode can, 2b . . . negative electrode can, 2c . . . gasket, 3 . . . electrode, 3a . . . positive electrode, 3b . . . negative electrode, 3c . . . separator

What is claimed is:

1. A nickel composite hydroxide, comprising:
   a composition represented by $Ni_{1-x-y-z}Co_xMn_yM_z(OH)_{2+A}$ (where $0 \leq x \leq 0.35$, $0 \leq y \leq 0.35$, $0 \leq z \leq 0.1$, $0 < x+y$, $0 < x+y+z \leq 0.7$, $0 \leq A \leq 0.5$, with M being at least one kind of additive element selected from the group consisting of V, Mg, Al, Ti, Mo, Nb, Zr and W),
   wherein the nickel composite hydroxide is composed of secondary particles in which spherical or lump-shaped nickel composite hydroxide particles, which are formed by a plurality of primary particles aggregated with one after another, are coupled with one after another in two dimensional directions,
   wherein the secondary particles have a volume average particle size (Mv) of 4 to 20 μm calculated by a laser diffraction/scattering method and an aspect ratio (Mv/L) of the volume average particle size relative to the width (L) of the secondary particles in a direction perpendicular to the coupling direction of the nickel composite hydroxide particles in a range from 3 to 20, and
   wherein the secondary particles have a high concentration layer containing cobalt and/or manganese inside each of the secondary particles.

2. The nickel composite hydroxide according to claim 1, wherein the nickel composite hydroxide has a deviation index [(D90–D10)/Mv] of particle size of 0.70 or less, which is calculated by using D90 and D10 in grain size distribution obtained by a laser diffraction/scattering method and a volume average particle size (Mv).

3. The nickel composite hydroxide according to claim 1, wherein the high concentration layer has a thickness of 0.01 to 1 μm.

4. The nickel composite hydroxide according to claim 1, serving as a precursor of a positive electrode active material for a nonaqueous electrolytic secondary cell.

5. A method of producing a nickel composite hydroxide according to claim 1, comprising:

generating a plate-shaped crystal core by allowing a crystal core generating aqueous solution composed of a metal compound aqueous solution containing cobalt and/or manganese to have a pH value of 7.5 to 11.1 at a standard liquid temperature of 25° C.; and setting a pH value of slurry for a particle growth containing the plate-shaped crystal core generated in the crystal core generating step to 10.5 to 12.5 at a standard liquid temperature of 25° C., while supplying a mixed aqueous solution including a metal compound containing at least nickel to slurry for the particle growth so that the plate-shaped crystal core is grown as particles.

6. The method of producing a nickel composite hydroxide according to claim 5, wherein the crystal core generating step carries out a generation of the crystal core in a non-oxidizing atmosphere having an oxygen content of 5 volume % or less.

7. The method of producing a nickel composite hydroxide according to claim 5, wherein in the particle growing step, slurry for the particle growth has an ammonia concentration of 5 to 20 g/l.

8. The method of producing a nickel composite hydroxide according to claim 5, wherein slurry for the particle growth is formed by adjusting the pH value of the plate-shaped crystal core containing slurry containing the plate-shaped crystal core obtained after completion of the crystal core generating step.

9. The method of producing a nickel composite hydroxide according to claim 5, wherein the nickel composite hydroxide serves as a precursor of a positive electrode active material for a nonaqueous electrolytic secondary cell.

10. A positive electrode active material for a nonaqueous electrolytic secondary cell composed of a lithium nickel composite oxide represented by $Li_{1+u}Ni_{1-x-y-z}Co_xMn_yM_zO_2$ (where, $-0.05 \leq u \leq 0.50$, $0 \leq x \leq 0.35$, $0 \leq y \leq 0.35$, $0 \leq z \leq 0.1$, $0 < x+y$, $0 < x+y+z \leq 0.7$, with M being at least one kind of additive element selected from the group consisting of V, Mg, Al, Ti, Mo, Nb, Zr and W),
   wherein the lithium nickel composite oxide is composed of secondary particles in which spherical or lump-shaped lithium nickel composite hydroxide particles, which are formed by a plurality of primary particles aggregated with one after another, are coupled with one after another in two-dimensional directions, and
   wherein the secondary particles have a volume average particle size (Mv) of 4 to 20 μm calculated by a laser diffraction/scattering method and an aspect ratio (Mv/L) of the volume average particle size relative to the width (L) of the secondary particles in a direction perpendicular to the coupling direction of the nickel composite hydroxide particles in a range from 3 to 20.

11. The positive electrode active material according to claim 10, further comprising:
   a specific surface area in a range from 0.3 to 2 m²/g.

12. The positive electrode active material according to claim 10, wherein the positive electrode active material has a deviation index [(D90–D10)/Mv] of particle size of 0.75 or less, which is calculated by using D90 and D10 in grain size distribution obtained by a laser diffraction/scattering method and the volume average particle size (Mv).

13. The positive electrode active material according to claim 10, wherein metal ions other than those of lithium of 3a site have a site occupation rate of 7% or less of metal ions and lithium ions of 3b site have a site occupation rate of 7% or less, obtained by Rietveld analysis of X-ray diffraction analysis.

14. The positive electrode active material according to claim 10, wherein the positive electrode active material has an orientation index of a (003) plane of 0.9 to 1.1 obtained by an X-ray diffraction analysis.

15. The positive electrode active material according to claim 10, further comprising:
a layer structure of a cubic crystal system.

16. A method of producing a positive electrode active material for a nonaqueous electrolytic secondary cell composed of a lithium nickel composite oxide represented by $Li_{1+u}Ni_{1-x-y-z}Co_xMn_yM_zO_2$ (where, $-0.05 \leq u \leq 0.50$, $0 \leq x \leq 0.35$, $0 \leq y \leq 0.35$, $0 \leq z \leq 0.1$, $0<x+y$, $0<x+y+z \leq 0.7$, with M being at least one kind of additive element selected from the group consisting of V, Mg, Al, Ti, Mo, Nb, Zr and W), comprising the steps of:
mixing the nickel composite hydroxide according to claim 1 with a lithium compound so that a lithium mixed material is formed; and
baking the lithium mixed material produced in the mixing step in an oxidizing atmosphere at a temperature of 650° C. to 980° C.

17. The method of producing a positive electrode active material according to claim 16, wherein the lithium mixed material has a ratio of the number of atoms of metals other than lithium contained in the lithium mixed material relative to the number of atoms of lithium in a range from 1:0.95 to 1.5.

18. The method of producing a positive electrode active material according to claim 16, further comprising the step of:
prior to the mixing step, carrying out a thermal treatment on the nickel composite hydroxide at a temperature of 300 to 750° C. in a non-reducing atmosphere or in an air flow.

19. The method of producing a positive electrode active material according to claim 16, wherein the oxidizing atmosphere in the baking step is an atmosphere containing oxygen of 18 volume % to 100 volume %.

20. A nonaqueous electrolytic secondary cell comprising:
a positive electrode, a negative electrode, a nonaqueous electrolyte and a separator,
wherein the positive electrode contains the positive electrode active material according to claim 10.

* * * * *